United States Patent
Kántor et al.

(10) Patent No.: US 10,796,222 B2
(45) Date of Patent: Oct. 6, 2020

(54) CONTACTLESS POSITION/DISTANCE SENSOR HAVING AN ARTIFICIAL NEURAL NETWORK AND METHOD FOR OPERATING THE SAME

(71) Applicant: Balluff GmbH, Neuhausen a.d.F. (DE)

(72) Inventors: Zoltán Kántor, Nemesvámos (HU); Zoltán Pólik, Gyoer (HU); Attila Szabó, Iszkaszentgyoergy (HU)

(73) Assignee: Balluff GmbH, Neuhausen a.d.F. (DE)

( * ) Notice: Subject to any disclaimer, the term of this patent is extended or adjusted under 35 U.S.C. 154(b) by 720 days.

(21) Appl. No.: 15/536,326

(22) PCT Filed: Dec. 16, 2014

(86) PCT No.: PCT/DE2014/100451
§ 371 (c)(1),
(2) Date: Jun. 15, 2017

(87) PCT Pub. No.: WO2016/095882
PCT Pub. Date: Jun. 23, 2016

(65) Prior Publication Data
US 2017/0344878 A1    Nov. 30, 2017

(51) Int. Cl.
*G06N 3/063* (2006.01)
*G06N 3/10* (2006.01)
(Continued)

(52) U.S. Cl.
CPC ............... *G06N 3/063* (2013.01); *G06N 3/10* (2013.01); *H01L 43/06* (2013.01); *G06N 3/0454* (2013.01); *G06N 3/061* (2013.01)

(58) Field of Classification Search
CPC .......... G06N 3/063; G06N 3/10; G06N 3/061; G06N 3/06; G06N 3/0454; G06N 3/04;
(Continued)

(56) References Cited

U.S. PATENT DOCUMENTS

| 5,247,584 A | 9/1993 | Krogmann |
| 5,485,908 A * | 1/1996 | Wang ....................... G07D 5/00 194/317 |

(Continued)

FOREIGN PATENT DOCUMENTS

| CN | 1989534 A | 6/2007 |
| CN | 103500262 A | 1/2014 |

(Continued)

OTHER PUBLICATIONS

Carullo et al. "Ultrasonic Distance Sensor Improvement Using a Two-Level Neural Network", IEEE Trans. IM, 1996, pp. 677-682.*
(Continued)

*Primary Examiner* — Li Wu Chang
(74) *Attorney, Agent, or Firm* — Collard & Roe, P.C.

(57) ABSTRACT

A contactless position and/or distance sensor for determining the distance, the spatial orientation, the material properties, or the like of a target object, and a method for operating the same, uses at least two sensor elements, which form a sensor module, Signals provided by the at least two sensor elements are jointly evaluated using at least one artificial neural network.

15 Claims, 26 Drawing Sheets

(51) Int. Cl.
*H01L 43/06* (2006.01)
*G06N 3/04* (2006.01)
*G06N 3/06* (2006.01)

(58) Field of Classification Search
CPC . H01L 43/06; G07D 5/00; G07D 5/02; G07D 5/08
See application file for complete search history.

(56) References Cited

U.S. PATENT DOCUMENTS

| | | | |
|---|---|---|---|
| 5,548,512 | A | 8/1996 | Quraishi |
| 5,898,304 | A | 4/1999 | Mandl |
| 6,111,402 | A | 8/2000 | Fischer |
| 6,166,995 | A | 12/2000 | Hoenes |
| 6,898,977 | B2 | 5/2005 | Ilnicki et al. |
| 7,263,781 | B2 | 9/2007 | Sielemann |
| 2006/0017578 | A1 | 1/2006 | Shubinsky et al. |
| 2013/0245879 | A1 | 9/2013 | Armijo Torres et al. |
| 2015/0153169 | A1* | 6/2015 | Cani ................ G01S 17/10 702/150 |
| 2016/0076912 | A1 | 3/2016 | Pólik et al. |

FOREIGN PATENT DOCUMENTS

| | | |
|---|---|---|
| DE | 42 01 502 A1 | 7/1993 |
| DE | 42 01 502 C2 | 12/1995 |
| DE | 197 51 853 A1 | 6/1998 |
| DE | 197 44 185 A1 | 4/1999 |
| EP | 0 494 632 A2 | 7/1992 |
| EP | 1 293 803 A2 | 3/2003 |
| EP | 1 462 661 A1 | 9/2004 |
| WO | 94/08258 A1 | 4/1994 |
| WO | 2014/146623 A1 | 9/2014 |

OTHER PUBLICATIONS

English Translation of Chinese First Office Action in Chinese Application No. 201480084568.4 dated Dec. 18, 2019.
International Search Report of PCT/DE2014/100451, dated Sep. 8, 2015.
Declaration according to Article 19, paragraph 1 in PCT/DE2014/100451 (dated Nov. 6, 2015).
Borkowski Dariusz et al: "Contactless Measurement of Substation Busbars Voltages and Waveforms Reconstruction Using Electric Field Sensors and Artificial Neural Network", IEEE Transactions on Smart Grid, IEEE, USA, vol. 6, No. 3, Apr. 17, 2015, pp. 1560-1569.

* cited by examiner

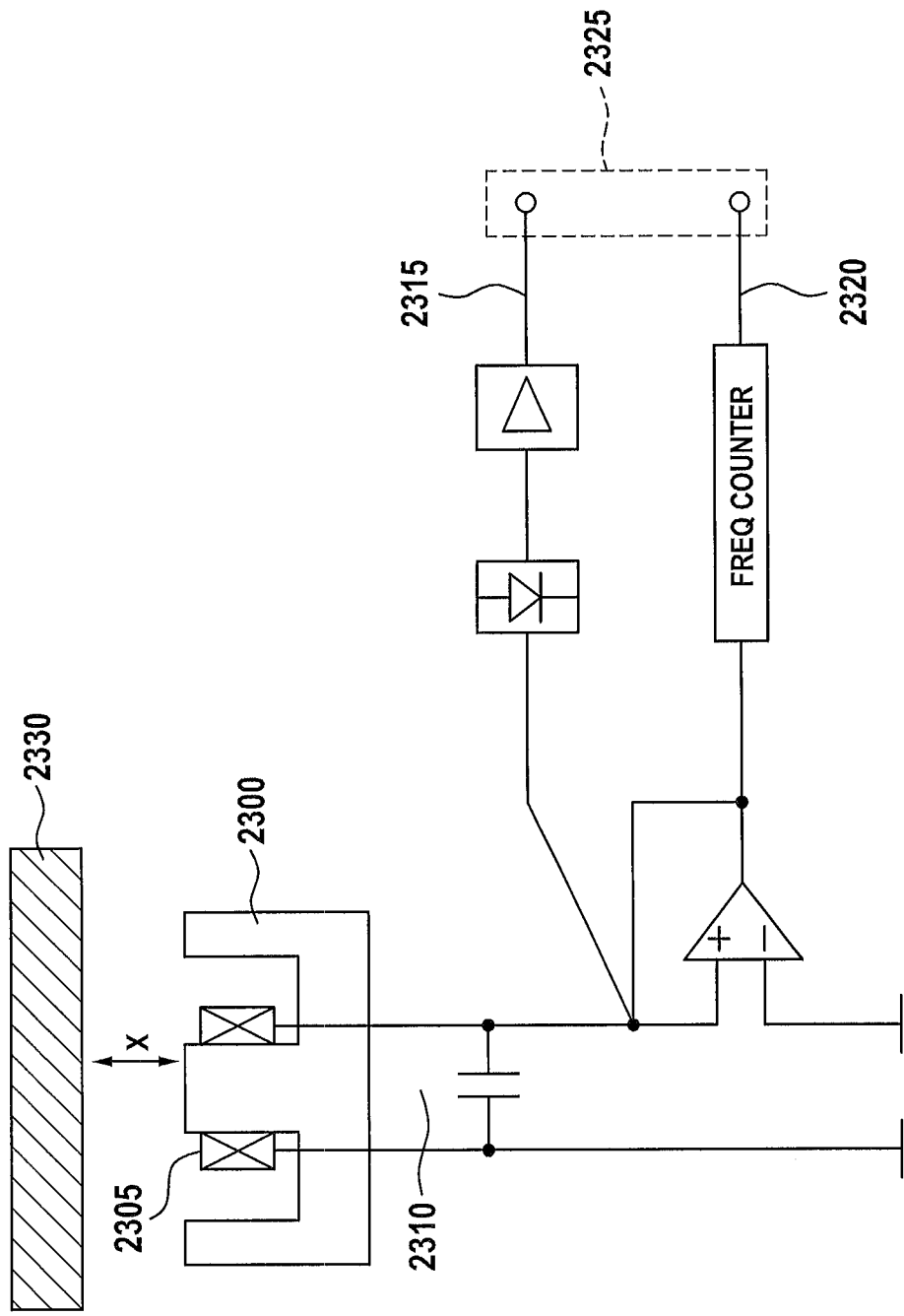

CONTACTLESS POSITION/DISTANCE SENSOR HAVING AN ARTIFICIAL NEURAL NETWORK AND METHOD FOR OPERATING THE SAME

CROSS REFERENCE TO RELATED APPLICATIONS

This application is the National Stage of PCT/DE2014/100451 filed on Dec. 16, 2014, the disclosure of which is incorporated by reference. The international application under PCT article 21(2) was not published in English.

PRIOR ART

The invention relates to a contactless position and/or distance sensor and a method for operating the same according to the independent claims.

In the field of metrology, position and/or distance sensors that work contactlessly are known. Document U.S. Pat. No. 5,898,304 A1 discloses a corresponding sensor arrangement having an artificial neural network (ANN), in which an electrical induction coil and an evaluation unit are provided, by means of which induction signals measured accordingly can be detected, processed and assessed.

The ANN described there comprises an input layer, at least one (hidden) intermediate layer, an output layer and weights provided at the connection points between two individual layers. Suitable values for the weighting factors are determined in a learning or training phase, in which test measurements are performed on a number of different target objects (targets) of known material and at a known distance from the sensor. The sensor arrangement is intended to be suitable for determining both distances and thicknesses, regardless of the material of the target object in question.

In the case of the aforementioned distance measuring systems, the inductance signals or inductance data measured by the measuring coil are subjected to a spectral analysis by means of the artificial neural network (ANN). The basis for this is the dependency of the measured spectrum on the spatial distance from the target object. In the case of the spectral analysis, numerical calculations in particular are performed on a measured quantity that changes over time, more specifically in the present case an electrical voltage and an electrical current. The aforementioned numerical calculations, however, require a significant computing effort and therefore prevent a compact design and an economical implementation of the sensor.

Document EP 1 462 661 A1 discloses a position sensor for a fluid cylinder-piston arrangement, which has a plurality of substantially identical sensor elements, by means of which a large detection range is covered. In particular, the signals of the sensor elements most relevant for the assessment and/or further processing are selected in this case. The sensor arrangement there comprises a sensor array formed by Hall effect sensors arranged in a cylinder wall, which sensor array has at least two Hall effect sensors distanced from one another in the movement direction of the piston and also a coil which can be acted on by an electrical current. In particular, the switching points of the Hall effect sensors can be adjusted, depending on the coil current, by means of the magnetic field generated by the coil. This approach not only enables an electronic selection of individual Hall effect sensors, but an interpolation between the individual Hall effect sensors, whereby the number of the Hall effect sensors can be kept low with simultaneously high precision of the detection of the position.

Document DE 197 51 853 A1 discloses a scanner element for an inductive position sensor with a divided detection region, which also comprises sensor elements having the same or a similar measurement principle. The detection region consists of alternately arranged, electrically conductive and non-conductive division areas, wherein the scanner element comprises a carrier element, on which a plurality of excitation elements for generating a homogeneous electromagnetic excitation field as well as one or more flat sensor windings are arranged. In particular, two adjacent scanning tracks with sensor windings of different periodicity and respective excitation elements laterally adjacent to the scanning tracks are arranged on the carrier element, such that a homogeneous, electromagnetic excitation field is formed in the region of the scanning tracks.

Furthermore, document WO 94/08258 A1 discloses a method for classifying movements of objects along a passage, in which a plurality of sensors arranged along the movement direction of the objects and within the passage are used in order to detect the objects. Here, a segmented representation of corresponding passage events is classified by means of an artificial neural network.

DISCLOSURE OF THE INVENTION

The problem of the invention is to specify a position and/or distance sensor of the above-mentioned type which further develops the prior art detailed here.

The invention is based on the concept of equipping a position and/or distance sensor with at least two probe or sensor elements and of jointly evaluating the measurement signals delivered from the at least two sensor elements by means of an artificial neural network. A corresponding measuring unit preferably has at least two sensor elements, which can be influenced by the measured variables and the possible measurement and ambient conditions and which have physically equivalent or similar measurement or operating principles, but preferably with different characteristic curves. A corresponding evaluation unit having an aforementioned artificial neural network is preferably trained by a calibration process or by a teaching/learning process.

In the case of the position and/or distance sensor according to the invention, it can be provided that the at least two sensor elements are operated statically or dynamically, for example are operated in a pulsed operation.

In the case of the aforementioned calibration or learning process, an artificial neural network is trained preferably for each sensor element on the particular measured variable in different conditions so that the measured variable can be determined independently of these conditions. Any inaccuracies of the sensor elements and/or the measurement electronics can thus be taken into consideration already when creating a training data record, such that, on account of the increased robustness of the signal evaluation with an artificial neural network according to the invention, corresponding manufacturing tolerances have substantially no influence on the subsequent measurements.

In the case of inherently known manufacturing processes, it can be disadvantageous if the training of the artificial neural network on a temperature-independent evaluation function requires a recording of the direct measurement signals of each sensor within a broad temperature range, in particular because of the uneconomically long period of time required for the signal detection dependent on temperature. Alternatively to the temperature-dependent detection of training data, data can also be detected at the manufacturing temperature, and the training data record can be supplemented with simulated measurement signals for other temperature values.

For the aforementioned reasons, economical sensor elements, for example those with magnetic field probes or printed coils, can additionally be used. An optimised printed circuit board technology can also be used for inductive and capacitive position and/or distance sensors, wherein the production costs, the signal strength, and any potential client-specific limitations (for example housing, mounting dimensions, etc.) are taken into consideration as primary optimisation parameters, in contrast to the much simpler evaluability of the primary measurement signals by means of electronic signal processing or equation-based mathematical evaluation.

In addition, position/distance sensors having, in comparison to the prior art, a significantly greater ratio of possible measurement length to sensor length necessary for this purpose can be provided, whereby practically any designs, for example client-specific designs, with practically unlimited measuring capability are also possible.

The use of an artificial neural network additionally enables an extended evaluation of the measurement results, including error and function diagnostics, and the provision of a user-friendly setting aid for the purposes of pre-setting or calibrating the position/distance sensor.

The execution of an aforementioned calibration or teaching/learning process has one or more of the following further advantages, depending on the given measurement situation:

- The aforementioned differences between the characteristic curves or (cross-) sensitivities of the individual sensor elements are subtracted in the evaluation of the at least two sensor signals or are no longer even included in the evaluation.
- The material properties of the target object (target) to be measured also, correspondingly, have no influence on the evaluation.
- Possible irregularities with regard to the arrangement of the sensor elements, more specifically both in respect of their spacing in the longitudinal direction, which should be where applicable as equidistant as possible, and deviations in the transverse direction, also have no influence on the evaluation.
- The evaluation does not presuppose any analytical or law-based correlation or evaluation algorithm between the current measured variable and the signals actually measured or between other variables and the measurement signals, since an artificial neural network with which a large range of complex non-linear systems can be simulated or mimicked can be trained on the basis of suitable training data. The evaluation does not require a regular characteristic curve, i.e. it does not require a linear or non-linear correlation ($1/x$, $1/x^2$, or sin/cos, etc.).
- The sensor elements do not have to be shielded from ambient-induced influences (for example installation, radiation, external magnetic fields, etc.). This is because, if the above-mentioned influences on the measured variables or measurement signals cannot be separated analytically, but the measurement signals contain/obtain clear information about the measured variables, this information is retrieved by an accordingly trained ANN.
- The evaluation does not require any subsequent processing of the output signals of a corresponding evaluation unit.
- The evaluation requires neither the uniformity nor the similarity of the physical measurement principles of the individual sensor elements.

For the above-mentioned reasons, a sensor having multiple sensor elements ("multi-element sensor") can also be provided, wherein the evaluation of the delivered sensor signals is not dependent on the knowledge of the correlation between the primary measurement signals both of the individual sensor elements and of the variable to be measured and the aforementioned influencing variables.

In the case of an aforementioned multi-element sensor, this can also be designed as a so to speak "universal probe", having a plurality of integrated measurement principles, wherein not only metals can be detected, but also other materials, such as plastics.

By means of an accordingly uniform platform, which can be used with a multiplicity of products (targets), the costs for the individual components of the position/distance sensor can also be reduced.

In the case of the method according to the invention, it can also be provided that the at least one artificial neural network delivers output signals which indicate the signal quality of the signals delivered from the at least two sensor elements and/or the evaluation quality of the evaluation by the at least one artificial neural network. Results delivered from the position and/or distance sensor according to the invention are thus even more meaningful.

Lastly, in the case of the method according to the invention it can be provided that the signals delivered from the at least two sensor elements are static or dynamic waveforms and serve as input signals for the at least one artificial neural network. An evaluation of such waveforms delivers even more reliable position and/or distance results with an evaluation according to the invention or with a position and/or distance sensor according to the invention.

DETAILED DESCRIPTION OF THE EXEMPLARY EMBODIMENTS

Figure 1:
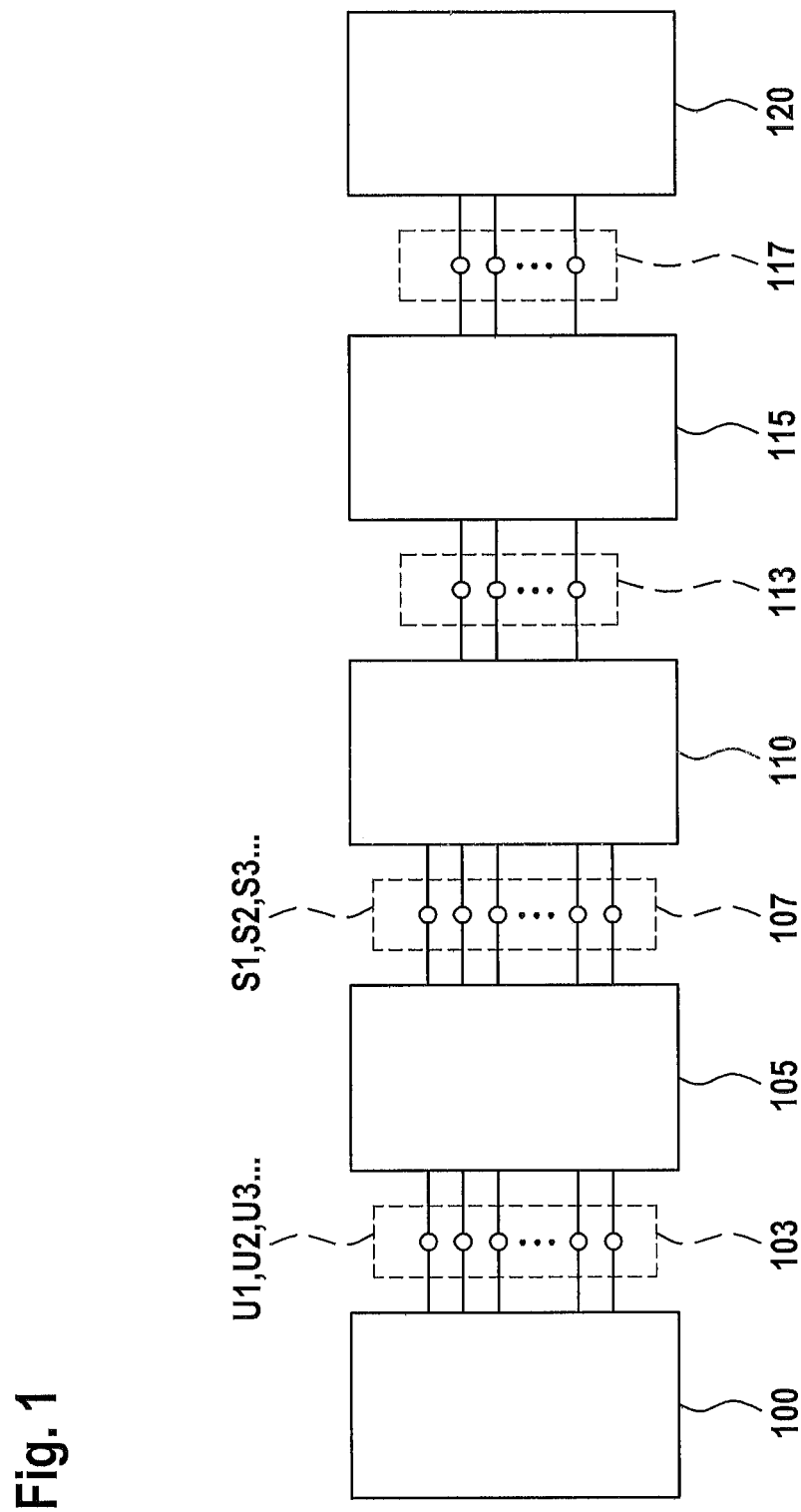
FIG. 1 shows the basic structure of a position/distance sensor according to the invention comprising an artificial neural network (ANN).

From WO 2014/146623 A1, an inductive position/distance sensor comprised here is known, which sensor is operated in a pulsed excitation mode, wherein a detected transient induction voltage caused by a target object in a sensor element is digitalised and the digital signal thus obtained is evaluated by means of an artificial neural network (ANN). The ANN is trained here so that the distance and/or the position of an approaching target object or target is detected or identified independently of the metal condition thereof. Alternatively, it is provided that, instead of the distance, the condition or quality of the target object is to be detected or determined independently of the actual distance.

A position/distance sensor according to the invention comprises a plurality of sensor elements, in particular at least two sensor elements, the delivered signals of which are evaluated by an ANN, wherein these sensor elements detect or sense either a consistent physical variable or different physical variables. Alternatively or additionally, it can be provided that measurement circumstances and/or ambient conditions present during the measurement, for example a metal mounting or a housing or a metal shielding of a measuring device or an ambient temperature, are also detected and evaluated accordingly. Again, alternatively or additionally, it can be provided that the physical principles used by the individual sensor elements are classified for the purposes of the evaluation, for example, are classified in respect of the geometric structure or the physical arrangement of the sensor elements, the uniformity of the signals delivered from the sensor elements, and the sensitivity, the crosstalk behaviour, the measurement resolution, and the detectable measurement range of one or more sensor elements.

In the exemplary embodiments described hereinafter, position and/or distance measurements in one, in two or in three directions or dimensions, including the detection of rotary movements of a target object to be detected, will be described. In addition, the spatial movement of a target object or at the same time different physical properties or material variables of the target object can also be detected with the position/distance sensor described herein.

In the case of the sensors according to the invention described hereinafter, a distinction can be made in principle between the following three sensor types or sensor arrangements:

1. An one-, two- or three-dimensional arrangement (array) of sensor elements which are essentially identical per se, wherein the individual sensor elements are arranged along a sensitive axis, a sensitive circle or arc of a circle, within a limited region, in a limited volume, or along an irregular surface or trajectory.
2. An arrangement (array) or group (cluster) of sensor elements working in accordance with the same or a similar physical principle, wherein the sensor elements have different measurement properties, such as a different sensitivity or cross-sensitivity with respect to the measured variable to be detected primarily and, possibly, with respect to the aforementioned different measurement circumstances and/or ambient properties.
3. An arrangement (array) or group (cluster) of sensor elements each working in accordance with a different physical principle, wherein the sensor elements differ for example in terms of the sensitivity or cross-sensitivity with respect to the measured variable to be detected primarily and, possibly, with respect to the aforementioned different measurement circumstances and/or ambient properties.

In the case of a measuring arrangement according to the invention, subordinate measurement principles are distinguished from primary measurement principles, for example, in the case of inductive measurements, self-inductive or transformer-like sensor elements are not treated as being similar, or, in the case of an optical primary measurement principle, energy-based sensor elements measuring flight time and/or measuring in accordance with the principle of triangulation, that is to say sensor elements working in accordance with different physical principles, are also taken into consideration.

It should additionally be noted that further sensor types can be derived by combining the aforementioned three types. Thus, an arrangement according to type 1 can be formed from sensor units that are identical per se, wherein each sensor unit has both a capacitively working and an inductively working sensor element. A sensor unit of this type then provides two primary measurement signals.

It should also be noted that one or more of the sensor elements can additionally comprise a temperature transducer or temperature sensor in order to detect an aforementioned corresponding ambient temperature (as aforementioned ambient condition).

The fundamental structure of a position/distance sensor according to the invention shown in FIG. 1 for detecting properties or parameters of a target object, such as the distance, the position or the material of the target object, primarily comprises a pre-processing module 105, which is connected to a sensor module 100 such that signals and/or data can be exchanged therebetween, for pre-processing the at least two primary or raw sensor signals 103 delivered from the sensor module 100. The sensor module 100 comprises at least two sensor elements (not illustrated), which provide the aforementioned at least two primary sensor signals 103. This pre-processing module also carries out the necessary adaptations of the signals in order to supply the signals 107 pre-processed in this way to an artificial neural network (ANN) 110. The output signals of the ANN 110 are in turn supplied to a post-processing module 115, by means of which the output signals 113 delivered from the ANN 110 are post-processed for the corresponding display by means of an output module 120, for example a screen module 120, and are supplied to the output module 120 as post-processed signals 117. By means of the output module 120, for example the magnitude of the electrical voltage or of the electrical current of the corresponding signals is adapted, where appropriate depending on the particular sensor type.

In the present exemplary embodiment the sensor module 100 comprises a specific predefined number of sensor elements (not shown in this illustration) based on the same or different physical measurement principles. These measurement principles can be inductive, capacitive, optical, magnetic, magnetostrictive or other physical operating principles. The sensor elements are arranged at predefined geometric positions within the sensor module 100. Sensor elements based on different measurement principles can work together or cooperate in a suitable manner described hereinafter in order to improve the detection quality or sensitivity of the position/distance sensor.

By means of the aforementioned signal pre-processing by the pre-processing module 105, a normalisation, amplification, scaling, digitalisation, reduction of the scanning rate, filtering, prior assessment, truncation (i.e. separation of signal components or corresponding signal reduction) or the like of the primary sensor signals 103 can be carried out, by means of which the input data 107 necessary for the ANN 110 is generated or optimised with the necessary data quality and/or the necessary data format. In the case of this signal pre-processing, a suitable mathematic method well known to a person skilled in the art of artificial neural networks can be used. As a result of the signal pre-processing, the number and/or the contents of the pre-processed signals 107 can be clearly distinguished from the primary sensor signals 103.

Figure 2:
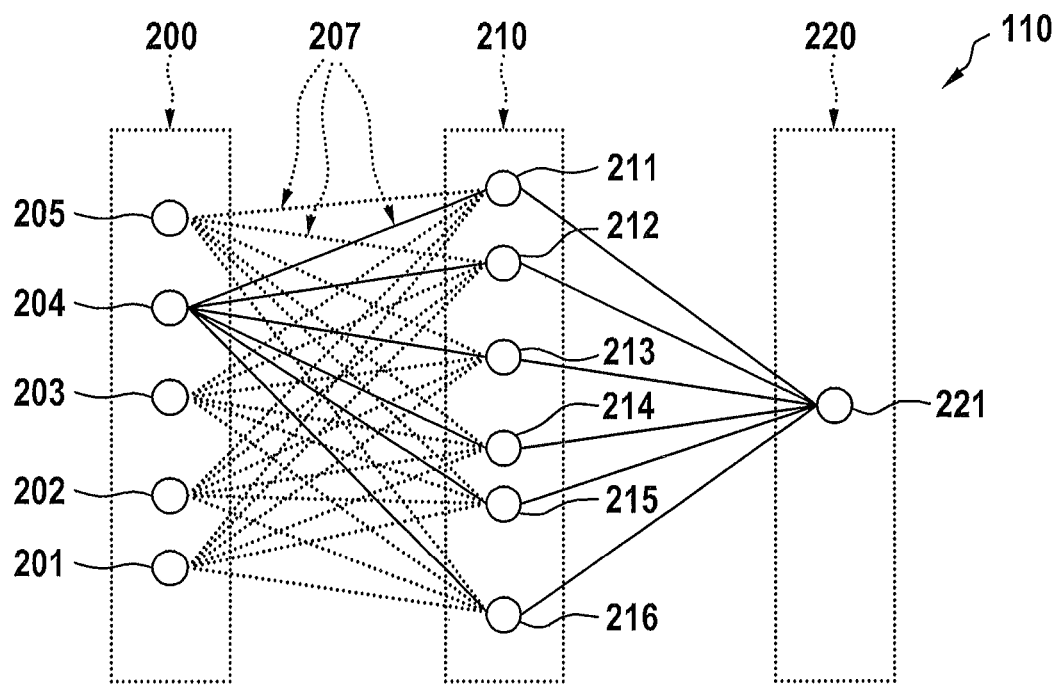
FIG. 2 shows the structure in principle of an artificial neural network (ANN) according to the prior art.

The ANN 110 has an input layer that is shown in FIG. 2, to which the pre-processed sensor signals are supplied, at least one hidden intermediate layer (also shown in FIG. 2), and a specific number of output neurons, by means of which the output data of the ANN 110 is generated.

The neural network is trained such that it extracts, from the supplied measurement signals 107, specific parameters which correspond to corresponding parameters of the target object (target) to be detected. These parameters are for example the distance between the sensor module 100 and the target object, the position of the target object above the sensor elements, the material of the target object, the mechanical density and/or the surface properties of the target object, or the like. The ANN 110 converts the pre-processed sensor signals 107 into output signals or output data 113, which correlate with the above-mentioned properties of the target object.

By means of the aforementioned post-processing module 115, the output data 113 of the ANN 110 can additionally be filtered, truncated, interpolated and/or adapted to the necessary input signal of an aforementioned output module 120. The output module 120 comprises devices necessary for this purpose for data conversion, signal amplification and/or for an aforementioned adaptation.

It should be noted that a position/distance sensor prepared in accordance with the invention potentially requires a microcontroller that is more powerful compared to the prior art or a similar data acquisition and/or data processing unit on account of the data processing by means of an ANN 110. On account of the learning or calibration of the ANN described hereinafter, more powerful calibration apparatuses with significant computing capacity are additionally required compared to the prior art.

The ANN 110 can be provided both as an inherently known "feedforward" network and as an also inherently known "recurrent (neural) network". FIG. 2 shows the typical structure of a feedforward ANN 110 comprised here. Connection lines arranged between neurons of an input layer 200 and an intermediate layer 210 have been shown in a dashed manner merely for illustration purposes.

The ANN comprises an input layer 200, at least one intermediate layer 210, which is not visible or is hidden (hidden layer), and an output layer 220. Each input node or each input neuron 201-205 of the input layer 200 is connected to each hidden neuron 211-216 arranged in the intermediate layer 210 via predefined weighting factors 207. Each hidden neuron 211-216 arranged in the intermediate layer 210 is connected to each output neuron 221 arranged in the output layer 220 via predefined weighting factors 207.

Should the ANN have more than one hidden intermediate layer 210, all input neurons 201-205 are then connected to each neuron arranged in the first intermediate layer 210 via predefined weighting factors, wherein each neuron of a preceding hidden intermediate layer is connected to each neuron of the subsequent hidden intermediate layer via predefined weighting factors, and wherein all neurons of the last hidden intermediate layer are connected to each output neuron of the output layer 220.

Each neuron executes an inherently known summation of the values provided by the corresponding preceding layer and acted on by predefined weighting factors and evaluates the resultant sum by means of a neural function. During the summation, a corresponding threshold value ("bias") can be added at or to the input of each neuron. The result of the evaluation of the neural function constitutes the output value of the respective neuron. Functions inherently known, for example an at least partially linear function, a sigma function, a hyperbolic tangent, or a sign function, can be considered as neural function.

The sole output neuron 221 arranged in the output layer 220 provides the output values of the entire ANN 110. The input layer 200 and the output layer 220 are connected to the environment of the ANN 110 or to the pre-processing unit 105 and the post-processing unit 115, whereas the afore-mentioned hidden layers or intermediate layers 210 are not directly accessible from outside.

Figure 3:
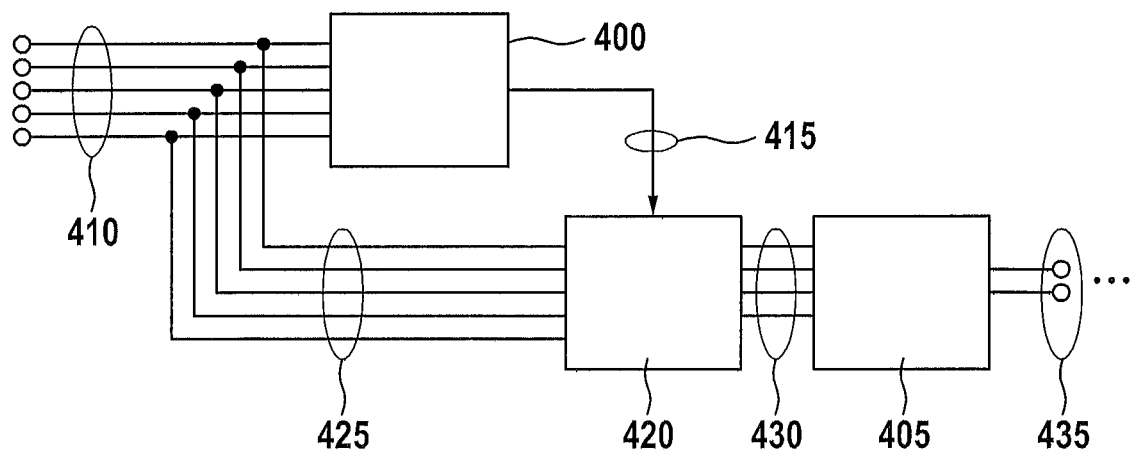
FIG. 3 shows an exemplary embodiment of a two-stage evaluation device of a position/distance sensor concerned here.

FIG. 3 shows an exemplary embodiment of an evaluation unit according to the invention with a two-stage evaluation schema, in which two artificial neural networks ANN1 400 and ANN2 405 are arranged. The individual sensor elements work in the present example on the basis of the same physical principle and form a one-dimensional or multi-dimensional arrangement (array). It should be noted that a consistent physical measurement principle is not a precondition of such an application of a two-stage or multi-stage evaluation schema.

The primary sensor signals 410, that is to say the raw signals delivered from the sensor elements, are firstly supplied to the input or an input layer (not shown here) of ANN1 400. ANN1 400 is trained to determine one or more influencing variables or parameters, for example the distance z between the target object and the aforementioned arrangement of sensor elements (array) necessary in order to perform a linear position determination for the target object. Alternatively or additionally, ANN1 400 can provide the data necessary for a normalisation of the primary sensor signals. The corresponding output data 415 from ANN1 400 is firstly supplied to a pre-processing module 420, which is rule-based in the present exemplary embodiment. In addition, the primary sensor signals are supplied 425 to the pre-processing module 420. The data pre-processed in accordance with the manner described above is then supplied 430 to the ANN2 405 or to an input layer (not shown) of ANN2.

In contrast to ANN1 400, ANN2 405 is trained to calculate and to deliver 435 the primary measured variables or measurement parameters, as well as the position of the target object in relation to the aforementioned arrangement (array) of the sensor elements.

It should be noted that the exact number of the output nodes of ANN1 400 and in particular ANN2 405 is dependent on the actual application. Thus, in the case of a three-dimensional or spatial arrangement of sensor elements, the ANN2 405 can provide position data relating to the target object based on x-, y- and z-axes.

A number of further application examples or exemplary embodiments of a position and/or distance sensor according to the invention will be described hereinafter.

EXAMPLE 1.1

Figure 4A:
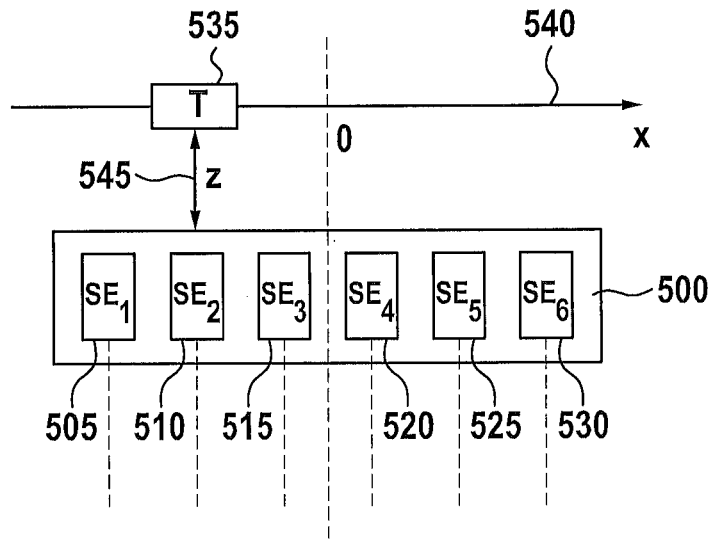
FIGS. 4-22 show different application examples or different exemplary embodiments of a position and/or distance sensor according to the invention.
Figure 4B:
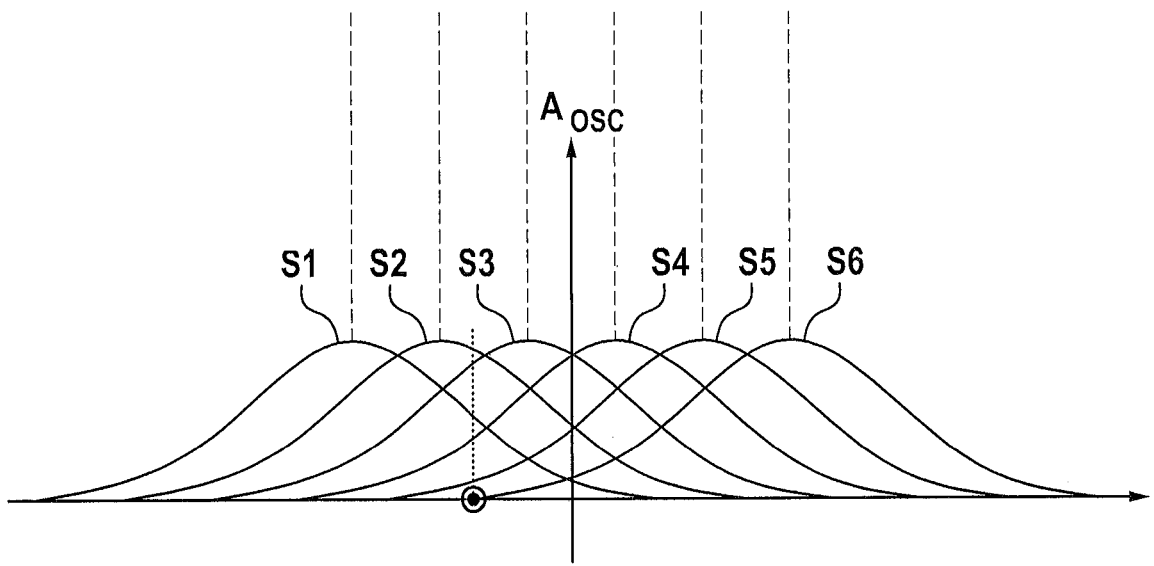

The position sensor shown in FIG. 4a with an ANN has an arrangement (array) 500 of, in the present case and by way of example, six inductive sensor elements (SE1, SE2, . . . , SE6) 505-530. The fundamental measured variable is in this case the position of a target object (target) 535 along an x-axis 540. The z-distance 545 is treated here as a complementary measurement value. Each of the sensor elements 505-530 is sensitive or reacts in a sensitive manner to electrically conductive and/or ferromagnetic target object materials. The amplitude of the oscillator (FIG. 4b) changes with the movement of the target object in the x-direction. If the target object moves along the sensor arrangement 500 with a fixed z-distance 545, the resultant oscillator amplitudes (S1, S2, . . . , S6) of the individual sensor elements 505-530 are dependent on the x-position of the target object (FIG. 4b). This dependency of the amplitude is typically hump-like, wherein the middle value of the substantially symmetrical hump corresponds to the location of the respective sensor element. The maximum change of the amplitude is dependent here on the corresponding z-distance. A possible offset and an adaptation of the individual sensor signals can be implemented by means of a pre-processing stage (not shown).

EXAMPLE 1.2

Figure 5A:
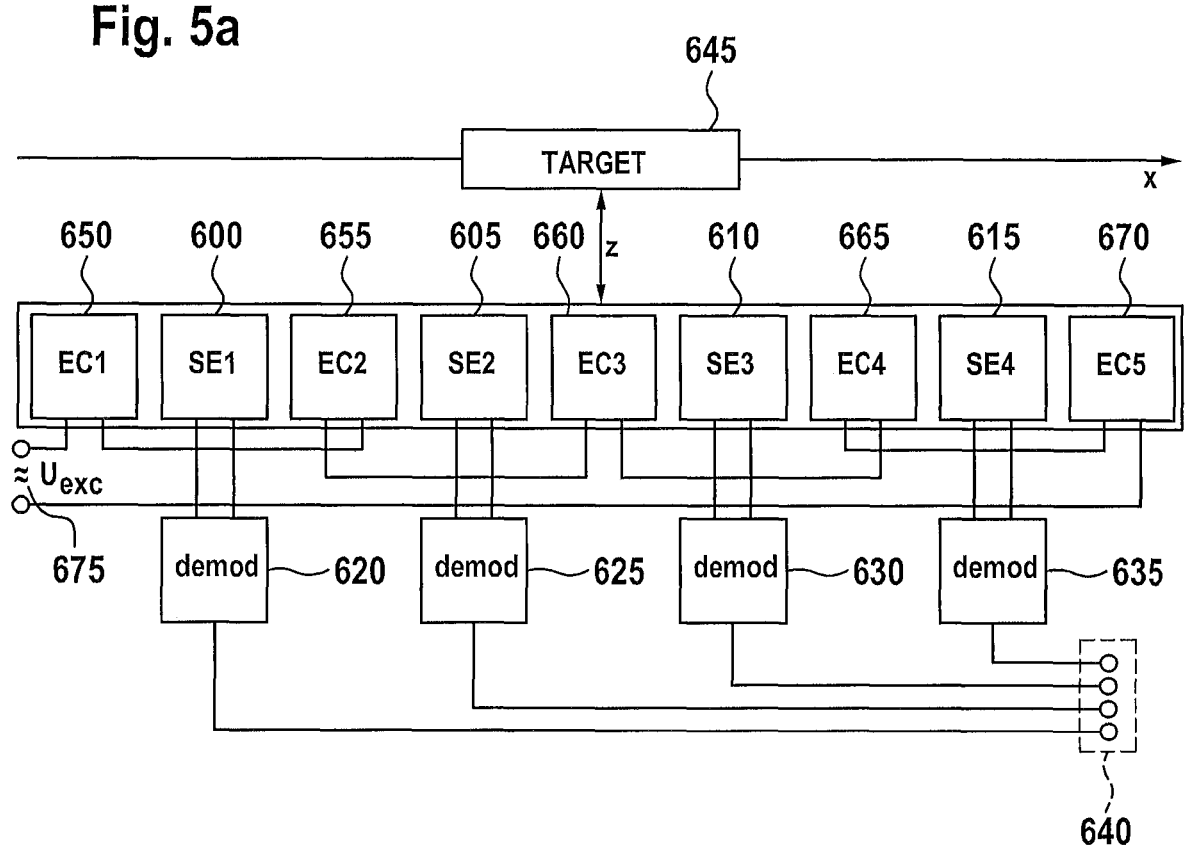
Figure 5B:
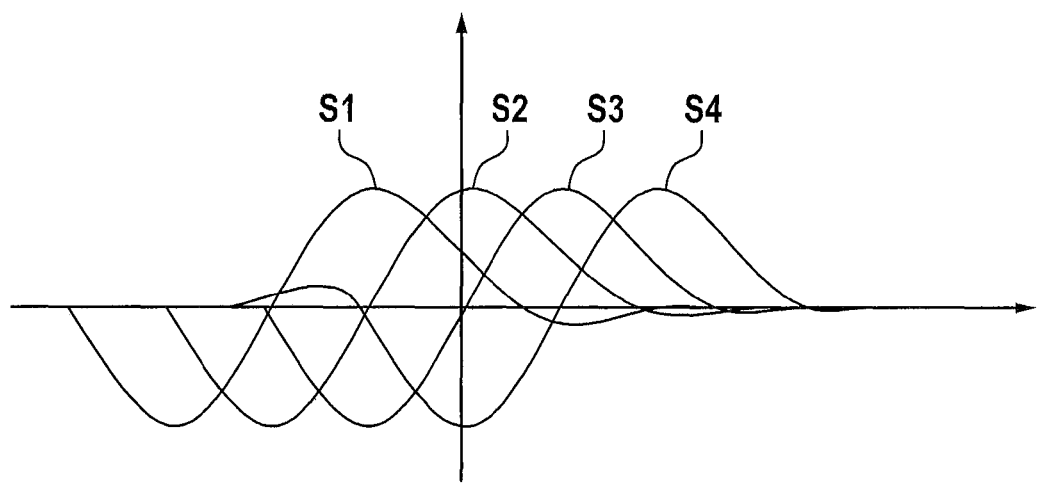

The sensor module shown in FIG. 5a has a number of, more specifically in the present case and by way of example four, sensor elements formed as electrical measuring coils (SE1, ..., SE4) 600-615. An electrical voltage delivered from the measuring coils is detected, demodulated in a phase-sensitive manner 620-635, and is fed into the input layer 640 of an ANN (not shown). The current position of a target object 645 can be determined by means of the ANN on the basis of these primary sensor signals. In addition to the shown arrangement (array) of sensor elements 600-615, an arrangement (array) of, in the present case and by way of example, five electrical excitation coils (EC1, EC2, ..., EC5) 650-670 is additionally provided, which for example are fed from a harmonic voltage or current signal 675, more specifically in such a way that, at a specific moment, adjacent excitation coils always have an opposite magnetic polarity. For a current or predefined z-distance, each sensor element has a specific wave characteristic (S1, S2, S3, S4), shown in FIG. 5b, wherein the wave amplitude is dependent on the current z-distance.

EXAMPLE 1.3

Figure 6A:
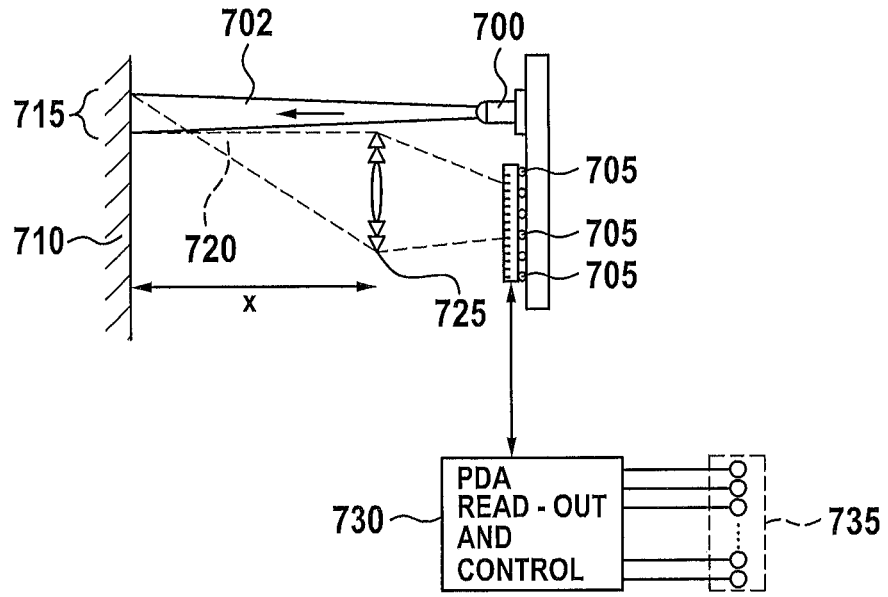
Figure 6B:
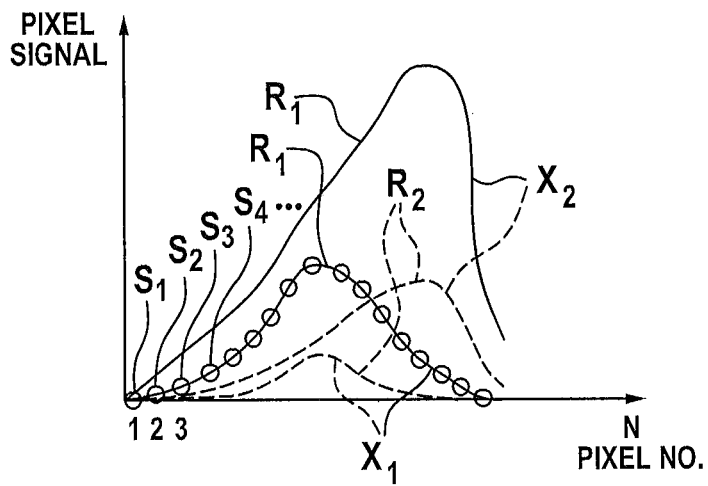

The position/distance sensor shown in FIG. 6a has a light-emitting diode (LED) 700, for example an LED working in the visible or in the infrared frequency range, and a photodiode row 705. The LED 700 emits a focused light beam 702, which forms an illuminating spot 715 on the surface of a target object 710. The light 720 backscattered from the target object 710 is directed in the present exemplary embodiment towards the photodiode row 705 by means of a Fresnel lens 725. The intensity distribution resulting at the photodiodes (FIG. 6b) is a measure for the distance of the target object 710, in the present case the primary measured variable. The intensity of the reflected light 720 is additionally dependent on the (surface) colour and on the morphology or topology of the surface of the target object 710, which are processed in the present case as complementary measured variables. In FIG. 6b, intensity distributions on the photodiode row 705 for two different object distances X1, X2 are illustrated, as well as for two different light scattering coefficients R1, R2. The measurement signals (S1, S2, S3, etc.) delivered from the photodiodes are read out by means of a control unit 730 and are supplied to the input layer 735 of an ANN (not shown).

The use of an ANN is particularly advantageous in this exemplary embodiment, since neither the LED nor the lens respectively the imaging geometry has to be ideal. In addition, the shown overall compact sensor can be adapted to a client-specific mounting geometry, and in particular the production costs can be significantly reduced.

In addition, a reduction of the number of input data of the ANN can be advantageous as pre-processing of the primary measurement signals. For example, should the photodiode row have 128 diode elements, the number of input data of the ANN can be reduced to just 16 by summing the intensity data of every 8 adjacent diode elements.

EXAMPLE 1.4

Figure 7A:
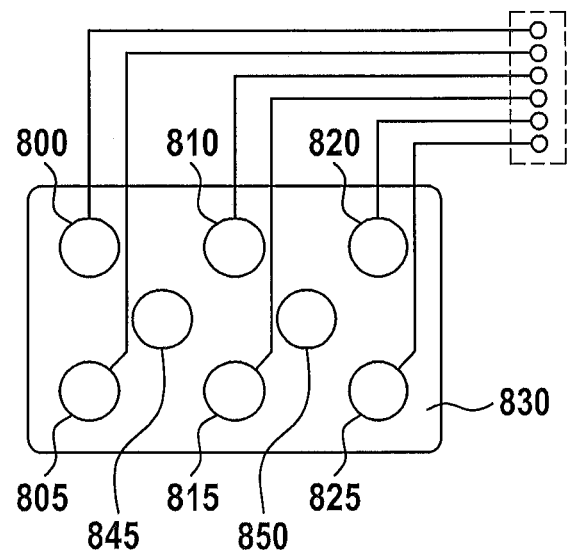
Figure 7B:
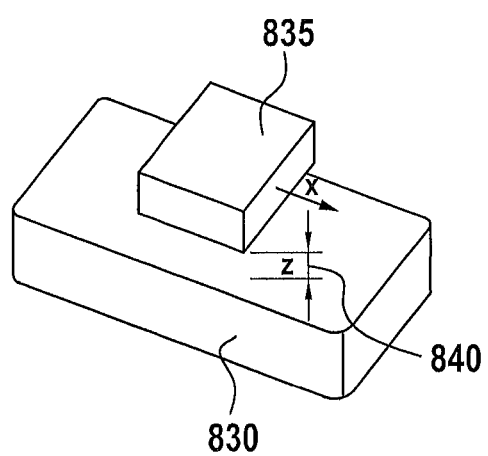

The exemplary embodiment shown in FIG. 7a comprises an arrangement (array) 830 of, in the present case and by way of example, two inductive excitation elements 845, 850, each operated preferably with an electrical alternating current, as well as six inductive receiver elements 800-825, which are formed in the present case as electrical coils provided with ferrite cores. The receiver elements 800-825 are sensitive to metal target objects, wherein the primary sensor signals of the individual receiver elements, as shown in FIG. 7b, are dependent on the x- and y-position of a target object 835 or correlate with this position data. The measurement signals additionally include information relating to the distance z 840 between the arrangement 830 of the sensor elements and the target object 835, which in the present case is processed in the form of complementary measured variables. An ANN (not shown) assesses the x- and y-position of the target object 835 and can additionally provide the aforementioned z-information 840 in a limited measurement range. It should be noted that instead of the shown inductive sensor elements based on the transformer principle, sensor elements that detect information self-inductively or capacitively can also be provided. It should also be mentioned that the shown arrangement 830 of the sensor elements 800-825 can be expanded or can be extended both in the x-direction and in the y-direction.

EXAMPLE 1.5

Figure 8:
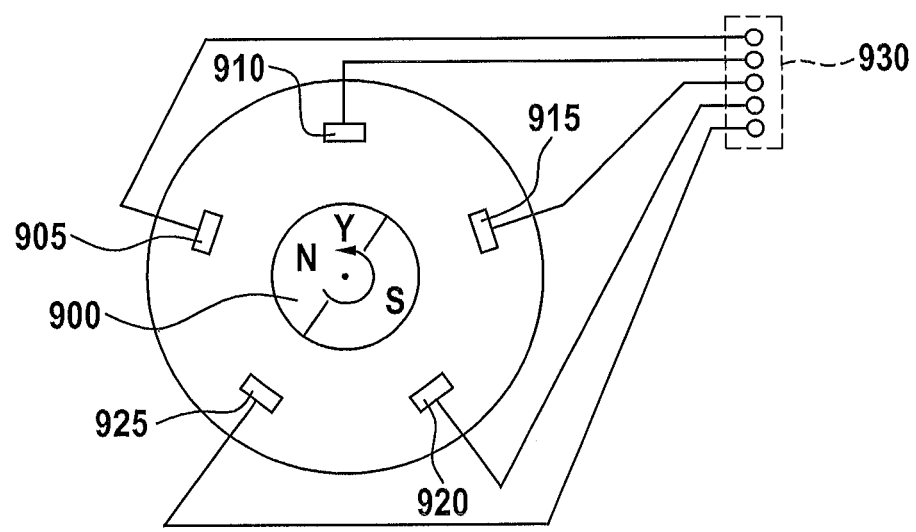

In the exemplary embodiment shown in FIG. 8, it is assumed that the target object itself is formed by a rotating permanent magnet 900 and that analogue magnetic field sensors 905-925 (for example based on the Hall effect, AMR or GMR) are arranged around this target object. Since the rotation of the magnetic target object 900 causes a periodic change to the output signals of the sensor elements and therefore the momentary angle of rotation of the target object can be derived in an inherently known manner from the sensor signals supplied to the input layer 930 of an ANN (not shown), a rotary encoder can be provided with the shown arrangement. Here, the ANN delivers normalised sin/cos output data. By means of a suitable post-processing step, an incremental output signal, for example a high-resolution digital quadrature signal, can also be generated. The advantage of the ANN in this exemplary embodiment lies in the fact that the positions of the magnetic field sensors 905-925 and the exact appearance or form of the magnetic target object 900 do not have to be regular or ideal, whereby possible design limitations or boundary conditions with regard to the development of a sensor concerned here are minimised.

EXAMPLE 2.1

Figure 9A:
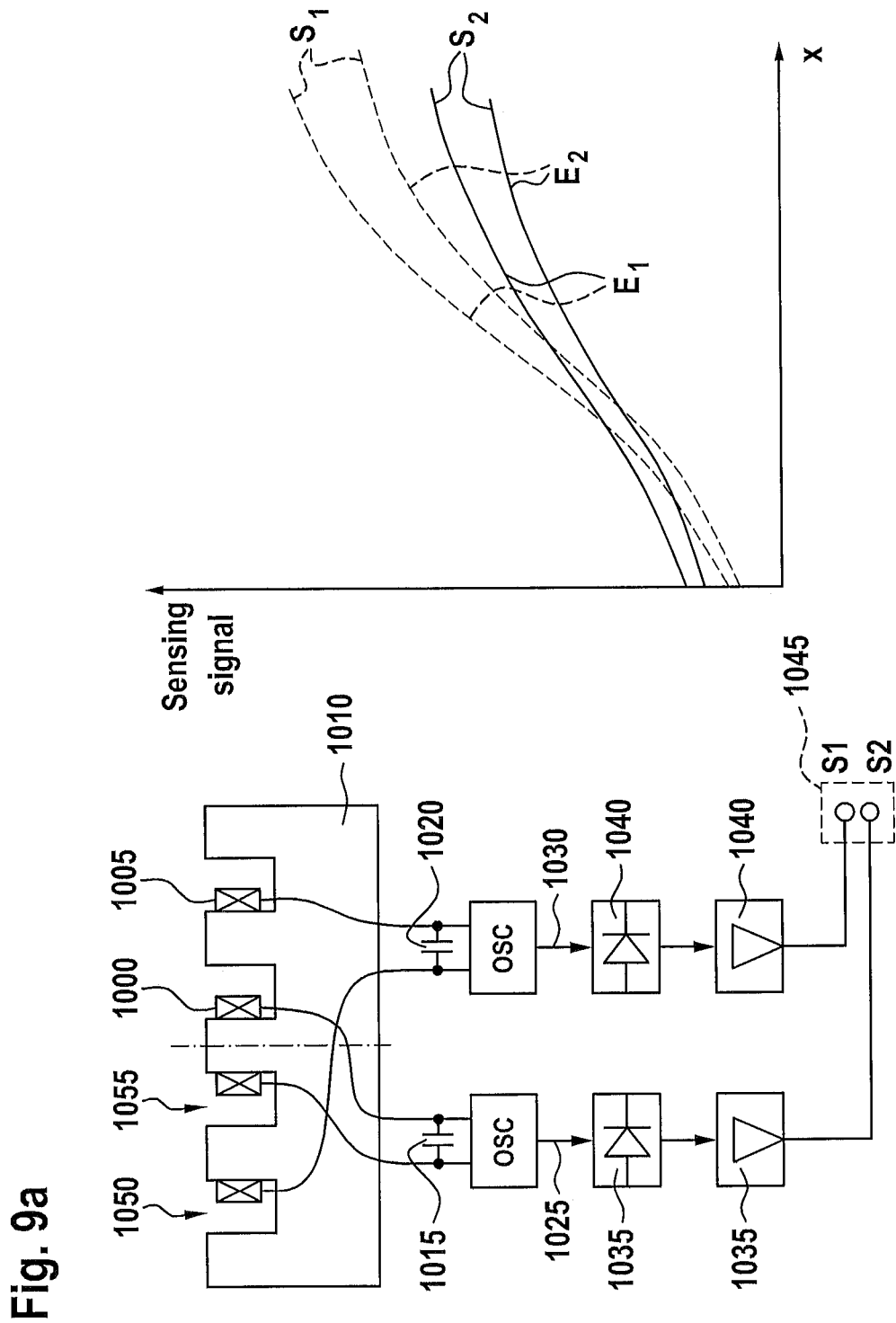
Figure 9B:
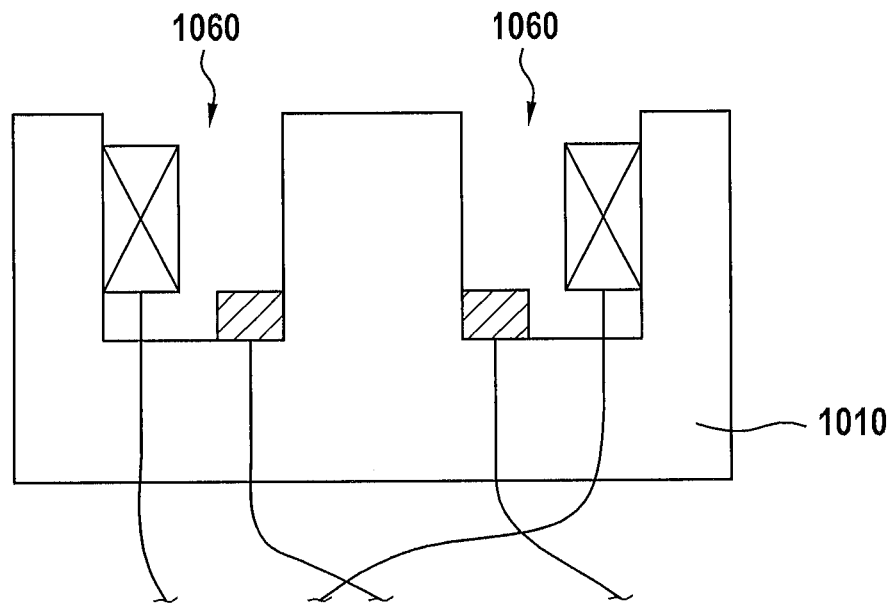
Figure 9C:
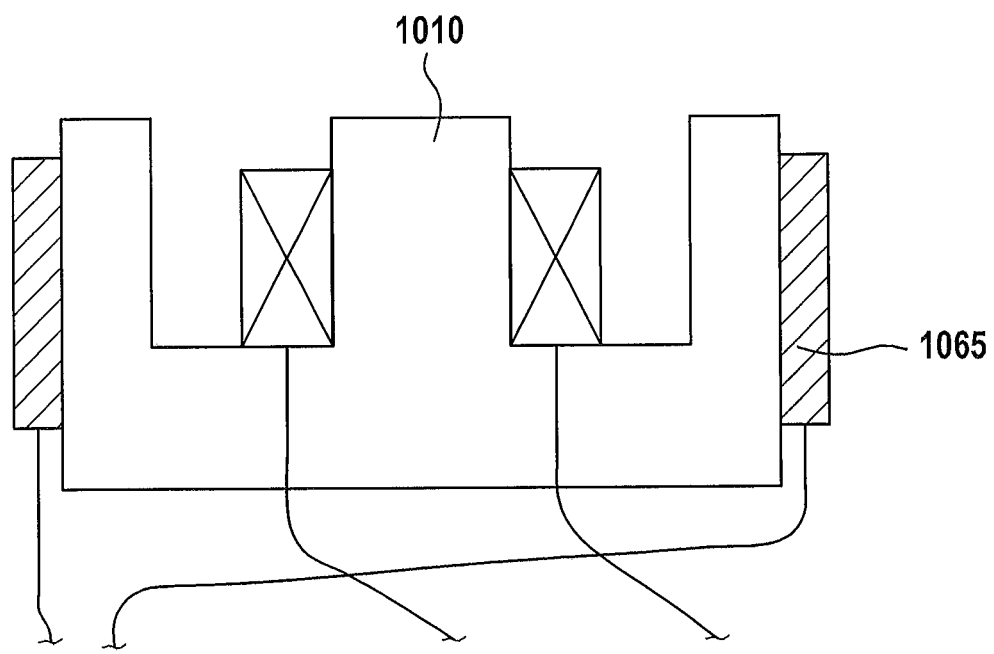

In the exemplary embodiments shown in FIGS. 9a-9c, two or more sensor coils 1000, 1005 are arranged in or around a ferromagnetic core 1010, wherein each of the coils 1000, 1005 serves as an inductive part of a corresponding LC oscillating circuit 1015, 1020, these being operated alternately. On account of the different position of the oscillating circuits within the sensor head, the resultant electrical oscillator voltages 1025, 1030 of the oscillating circuits 1015, 1020 are sensitive to differing degrees in respect of the target object distance and the metal environment (what are known as ambient conditions) of a target object (not shown) and/or sensor coils 1000, 1005. The detected oscillator voltages 1025, 1030 are each demodulated 1035, 1040, and are supplied to the input layer 1045 of an ANN (not shown), wherein the ANN is trained to calculate from this the target object distance, more specifically in particular independently of the aforementioned ambient conditions.

The three different implementations shown in FIGS. 9a-9c concern more specifically: In example (a) the two coils 1000, 1005 are arranged in two different opening regions or recesses 1050, 1055 of the ferrite core 1010. In example (b) the two coils 1000, 1005 are arranged within the same recess 1060 of the ferrite core 1010. In example (c), by contrast, one of the two coils 1065 is arranged completely outside the ferrite core 1010 and serves as an inductive sensor element.

In the case of the measurement curves illustrated next to FIG. 9a, the oscillator amplitudes dependent on the distance, i.e. the characteristic curves of the two embedded sensor units S1, S2 are illustrated for two possible installation situations E1, E2, more specifically in the case of an uninstalled measurement situation (E1) and a sensor unit installed in a steel structure (E2).

The electrical coils shown in FIGS. 9a-9c can also be used in a mixed operation in that one of the two coils is part of an LC oscillating circuit and is brought into oscillation with a corresponding amplifier, whereas the other coil serves as a secondary coil of a transformer arrangement and receives a talk-though signal from the first coil. Both the oscillation amplitude of the LC oscillating circuit and the phase and the amplitude of the voltage induced in the receiver coil are influenced by the distance of the target object and the measurement conditions, for example the target object material, the installation material, the installation geometry, or the like.

EXAMPLE 2.2

Figure 10:
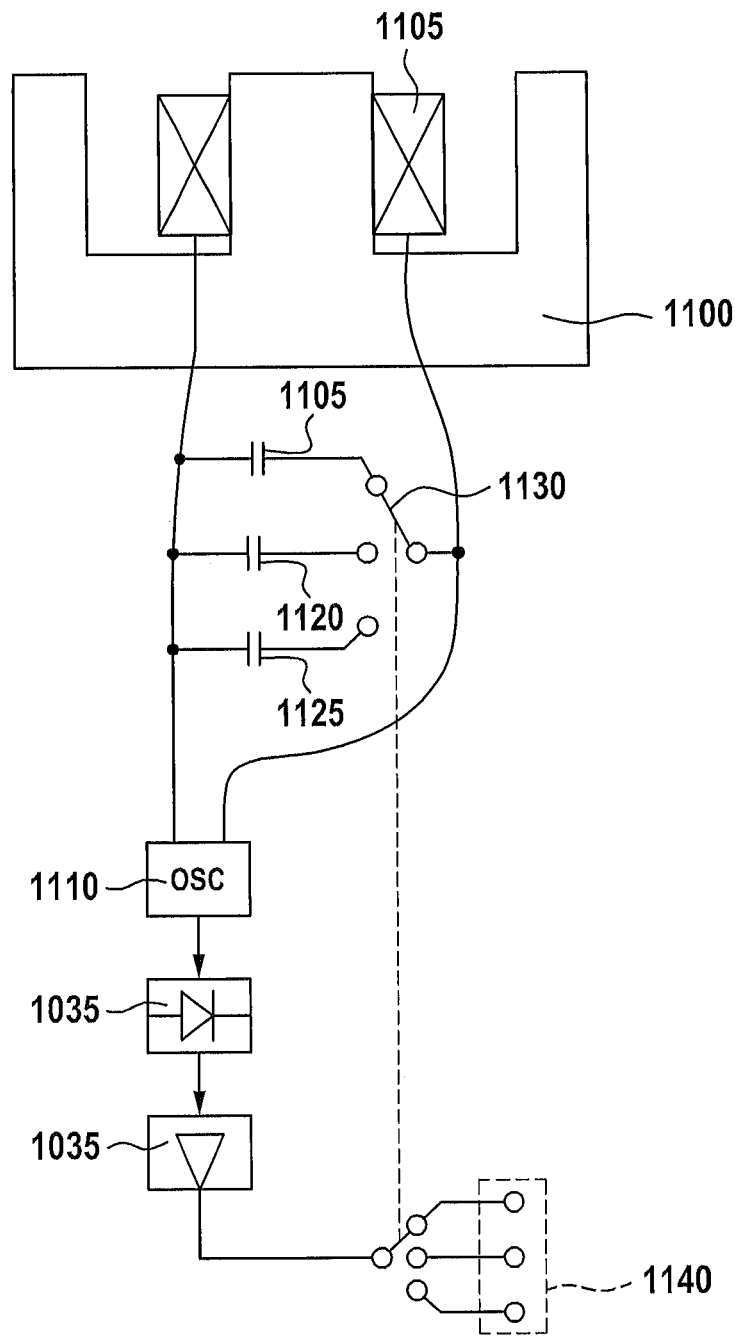

In the exemplary embodiment shown in FIG. 10, an inductive sensor coil 1105 provided with a ferrite core 1100 is used as part of an LC oscillating circuit 1110, wherein capacitors 1115-1125 connected in parallel are each connected in alternation with different capacitance values by means of a low-resistance analogue multiplexer 1130 in order to detect the oscillating circuit amplitude for different frequencies. The corresponding demodulated amplitude values 1135, which are also digitalised by means of a conventional A/D converter (not shown here), are supplied to the input layer 1140 of an ANN (not shown). Since the influence of the aforementioned ambient conditions and the material of the target object also differ with different oscillation frequencies, the ANN can be trained to determine the target object distance independently of the aforementioned conditions.

EXAMPLE 2.3

Figure 11:
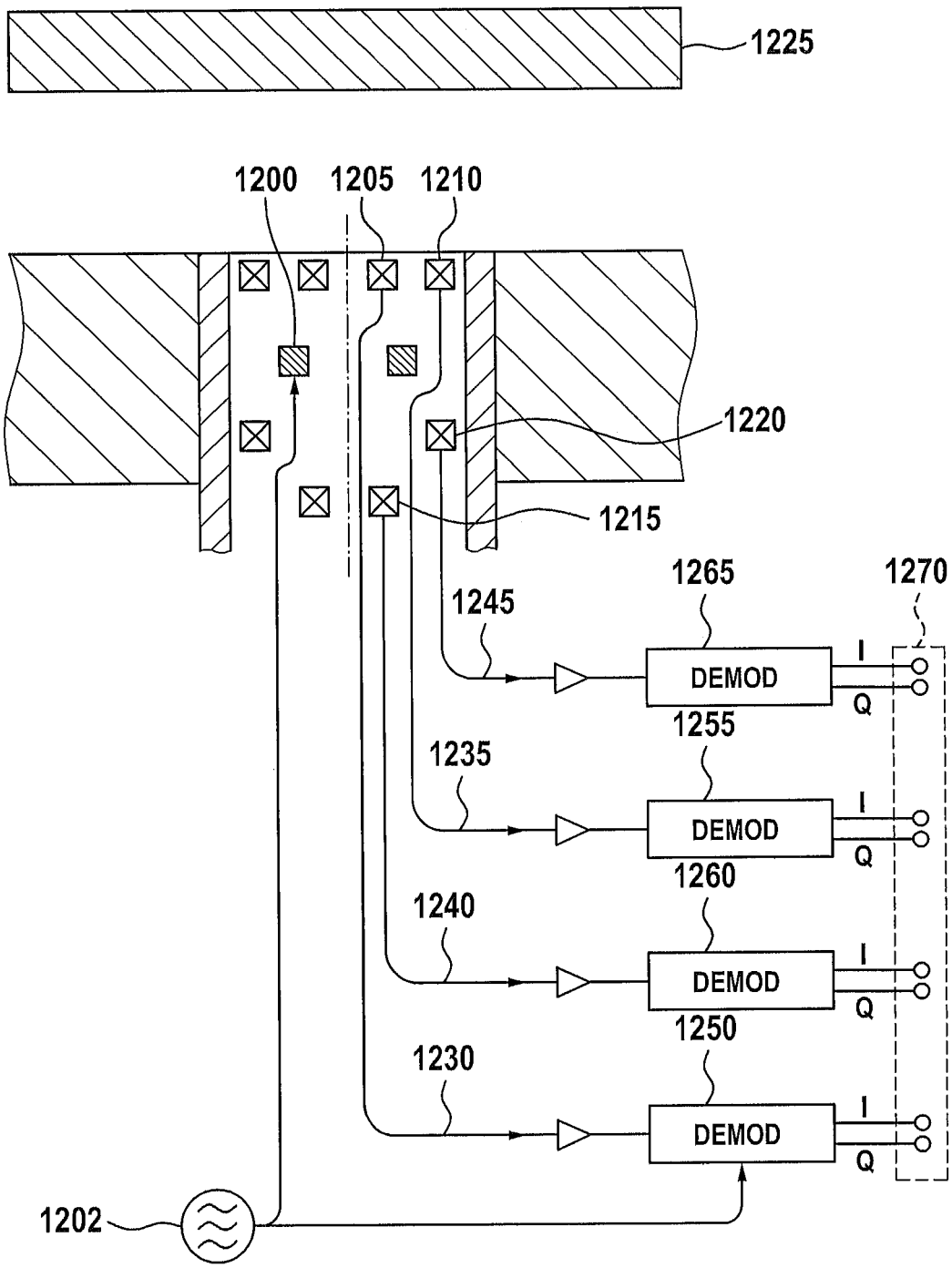

FIG. 11 shows an above-mentioned "type-2" sensor, which has a coreless excitation coil 1200, by means of which the shown measuring system is excited with a high-frequency magnetic field or is supplied with the corresponding energy 1202. The system also comprises measuring coils 1205-1220 arranged at various positions, by means of which position-dependent information relating to a target object 1225 and the material-based nature thereof are detected. The signals 1230-1245 detected by each sensor element 1205-1220 are firstly demodulated in a phase-sensitive manner 1250-1265. The resultant demodulated voltage signals are supplied to the input layer 1270 of an ANN (not shown), which is trained to calculate, on the basis of the voltage signals, the distance between sensor 1205-1220 and target object 1225, said distance being independent of the material nature of the target object 1225. The measuring coils 1205-1220 can be arranged geometrically differently, wherein these can each have different measuring sensitivities with regard to the target object 1225 and/or material thereof. In accordance with a particularly advantageous arrangement, pairs of the measurement coils are connected to one another in series in opposite directions. Since the majority of the voltages induced in the individual coil elements originates from the direct crosstalk of the excitation coil, the magnetic excitation signal delivered from the excitation coil 1200 can be suppressed even with non-optimal numbers of turns of the individual coil elements, and higher signal amplifications and improved signal-noise ratios can be achieved nevertheless.

The coil arrangement shown in FIG. 11 can also be applied or used in pulsed operation, more specifically if the exciter coil is operated with a current pulse instead of a high-frequency excitation and the induced receiver signals are digitalised and stored with high scanning rate instead of a described demodulation, and selected data elements of the time-dependent waveforms are supplied to the receiver coils of the input layer of the ANN.

EXAMPLE 2.4

Figure 12:
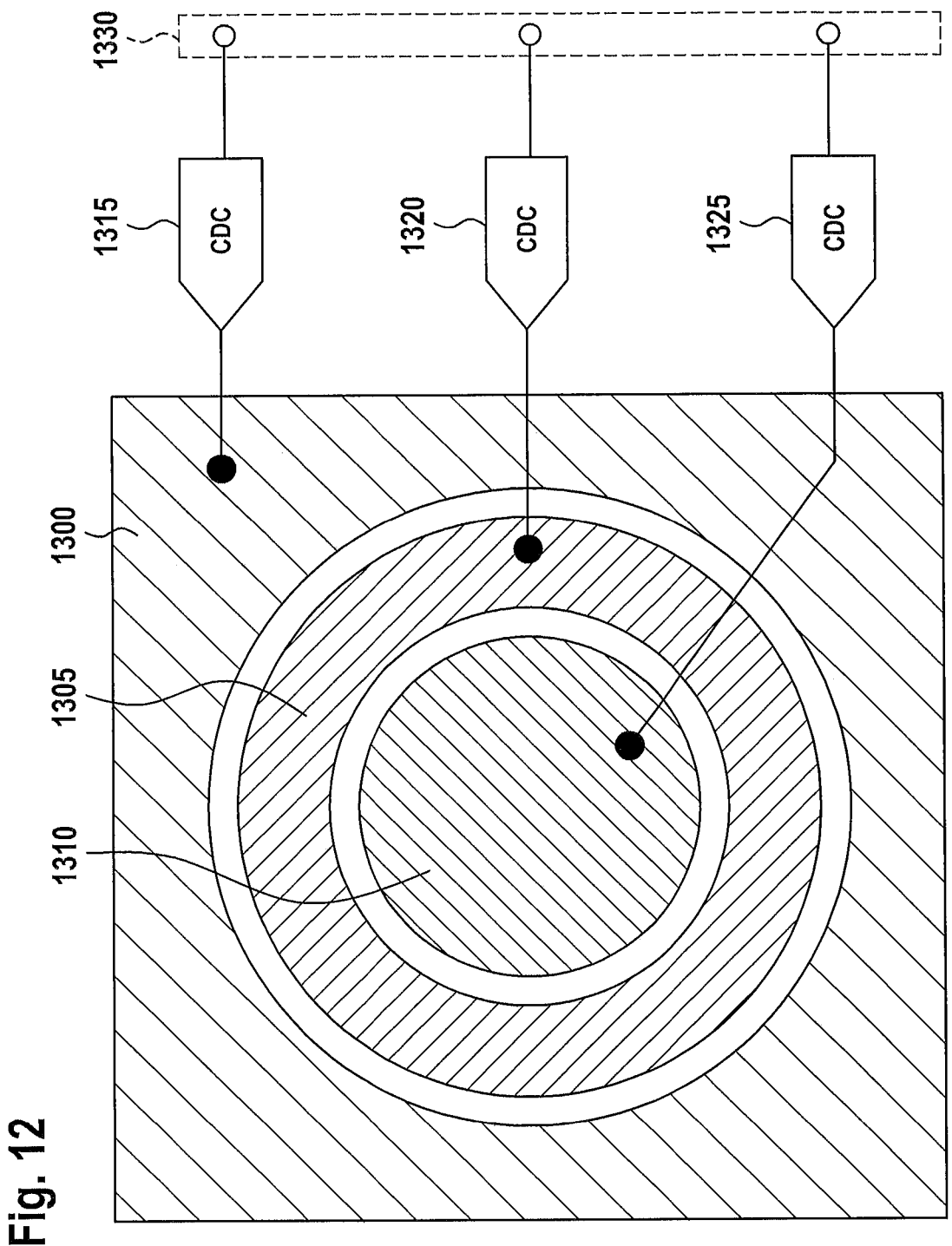

In the exemplary embodiment shown in FIG. 12, capacitively measuring sensor elements 1300-1310 of different size and geometry are provided, wherein the measured capacitances are digitalised by means of a corresponding capacitance-to-digital converter (CDC) 1315-1325, and the sensor signals thus digitalised are applied to the input layer 1330 of an ANN (not shown). The sensor elements 1300-1310 have a different sensitivity compared to a target object (not shown) and the surrounding environment, which in particular is a metal environment, wherein the ANN is trained so that it can determine the distance between sensor and target object, said distance being independent of the surrounding environment.

EXAMPLE 2.5

Figure 13A:
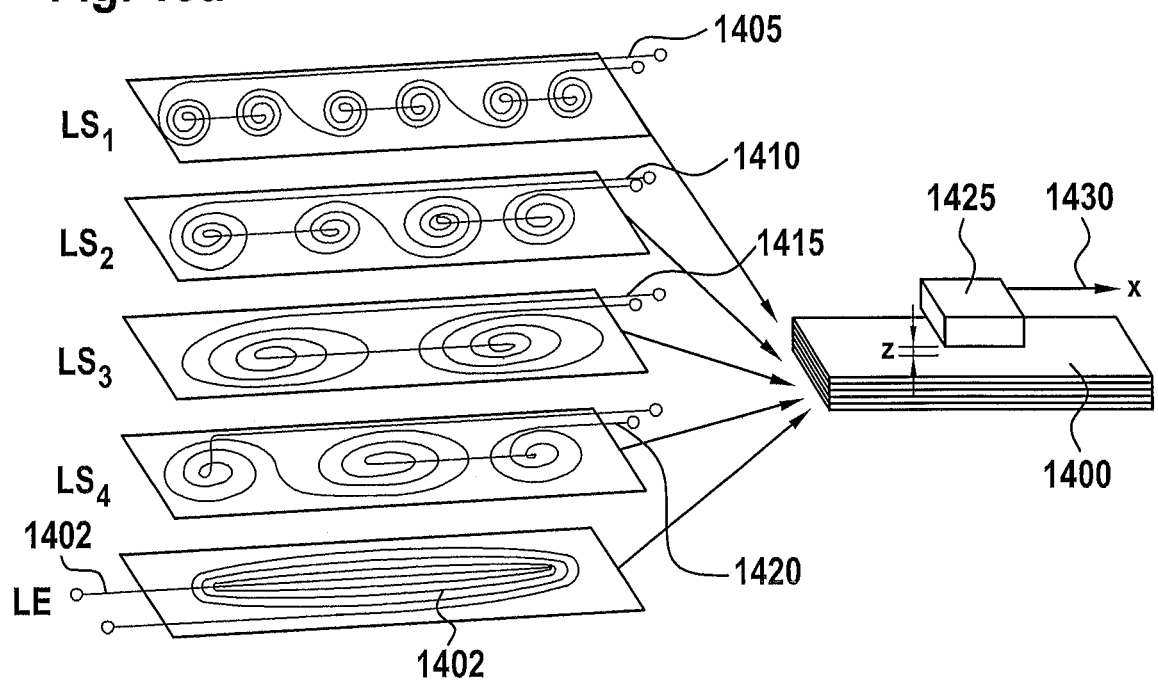
Figure 13B:
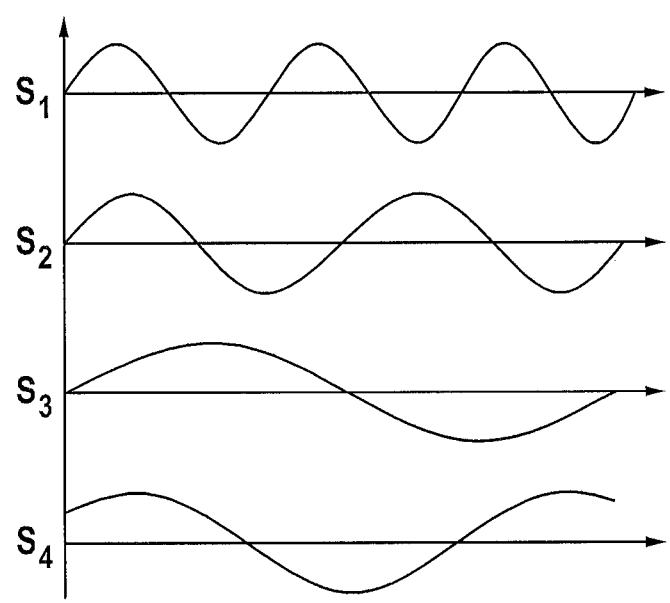

In FIG. 13a an exemplary embodiment of a position-sensitive, multi-layer (LE, LS1, . . . , LS4) and substantially planar converter 1400 is shown. The shown multi-layer coil printed circuit board has an excitation coil 1402 and a plurality of inductive receiver coils 1405-1420. The geometries of the receiver coils 1405-1420 are not necessarily formed in a regular manner, as shown in FIG. 13a, but can be optimised with regard to the signal strength, the signal-noise ratio and/or the production costs. With a metal target object 1425 arranged above the converter 1400, each individual receiver coil 1405-1420 delivers different information or signals S1, S2, S3, S4 (FIG. 13b), depending on the position 1430 of the target object 1425. On account of the aforementioned irregularity, this information cannot be evaluated analytically, i.e. on the basis of formulas. The advantage of the use of an ANN (not shown here) lies in the fact that it can be trained to nevertheless be able to determine or estimate the distance and/or the position of the target object on the basis of this information.

It should be noted that even planar converters of the present type known in the prior art, which have sin/cos-like or even linear measurement characteristics, usually also have interfering properties in an actual measurement situation, whereby the assessment results still have to be subjected to a downstream linearization process.

EXAMPLE 2.6

Figure 14:
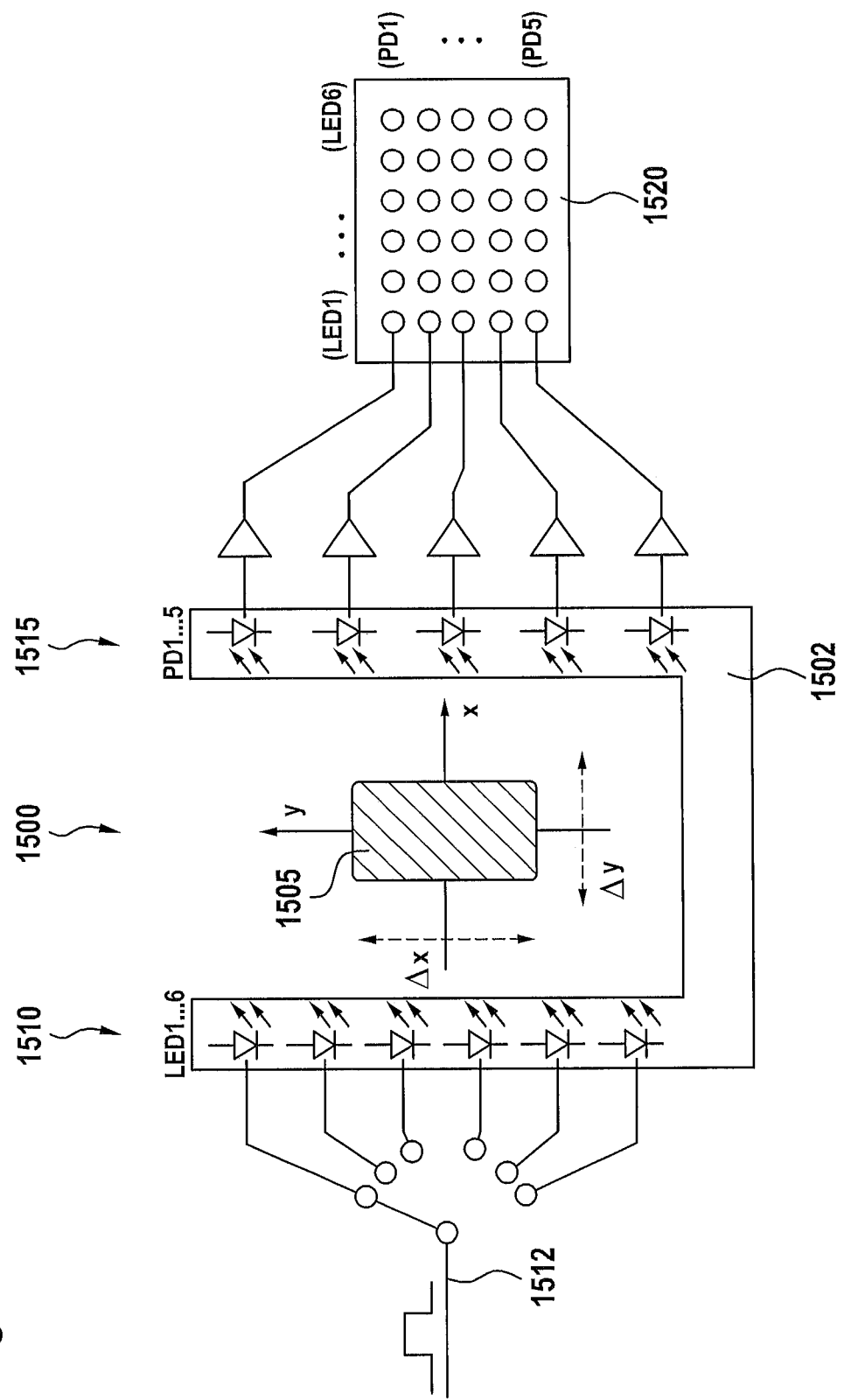

In the exemplary embodiment shown in FIG. 14, the x-and y-position of an optically opaque target object 1505 arranged in a gap or interstice 1500 of a carrier element 1502 are determined. By means of an arrangement (array) 1510 of sequentially energised 1512, light-emitting diodes (LEDs), an arrangement (array) 1515 of photodiodes is irradiated such that the optical shadow of the target object 1505 can be detected. The light intensity matrix 1520 delivered from all pairs formed of LED and photodiode is detected and is supplied to the input layer (not shown in the present case) of an ANN. The ANN is trained so that it can determine the x- and y-position of the target object on the basis of this information. In addition, the size of the target object can be determined as complementary measured variable with the information.

EXAMPLE 3.1

Figure 15:
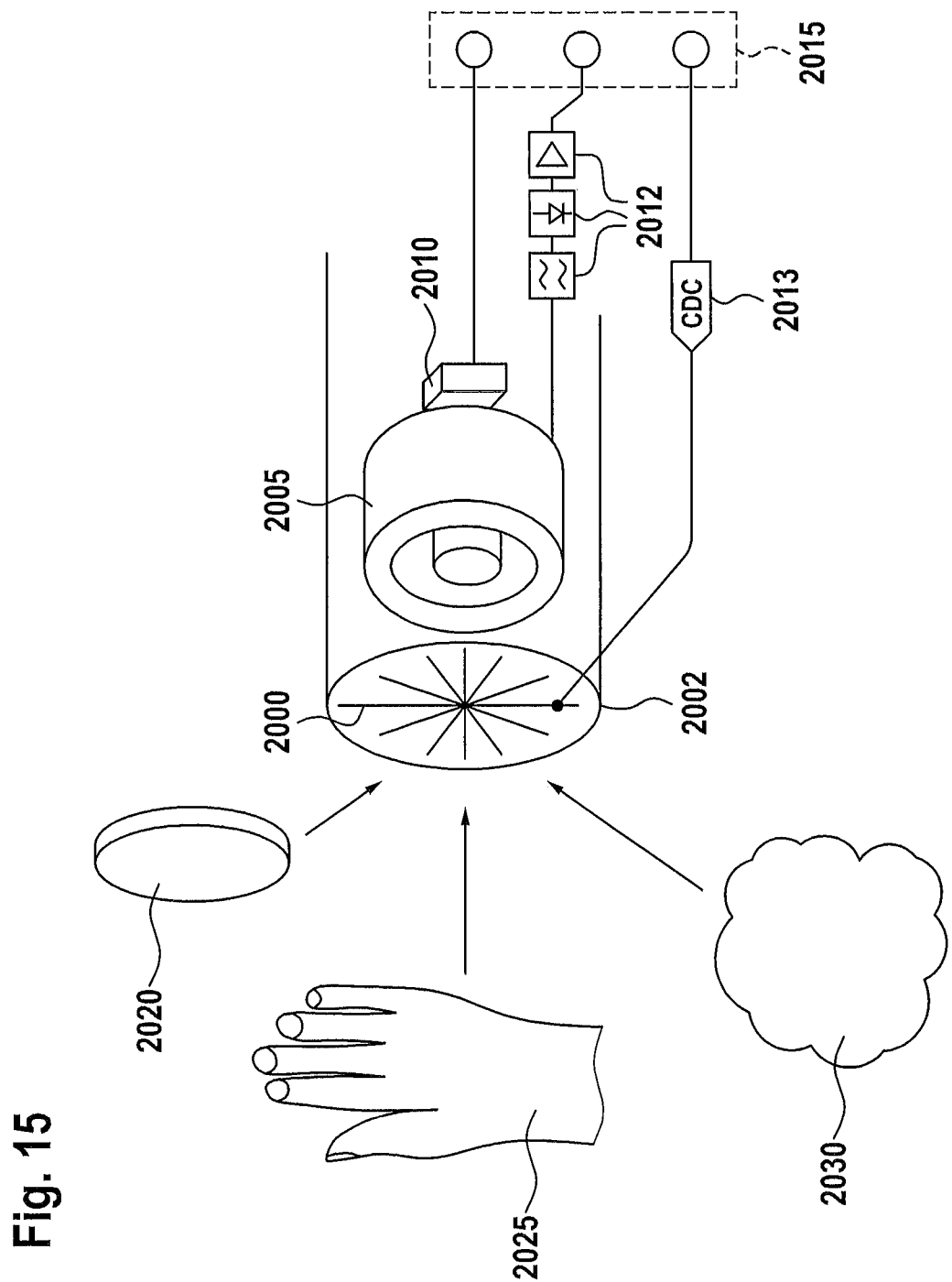

The multi-sensor shown in FIG. 15 has a number of sensor elements 2000-2010 accommodated in a housing or sensor head 2002 and working physically completely differently, more specifically in the present exemplary embodiment with measurement principles that work capacitively 2000, inductively 2005, optically (not shown here) and/or in a Hall-effect-based manner 2010. By means of an ANN (not shown) with input layer 2015, the measurement signals delivered from these sensor elements 2000-2010, and post-processed 2012, 2013 where applicable in the manner described above, are evaluated in order to thus detect the presence of any target object 2020-2030, more specifically in particular independently of the material thereof. The material of the target object can be, for example, a metal 2020, a non-metal, such as plastic, a liquid 2030, or even a biological object 2025.

EXAMPLE 3.2

Figure 16:
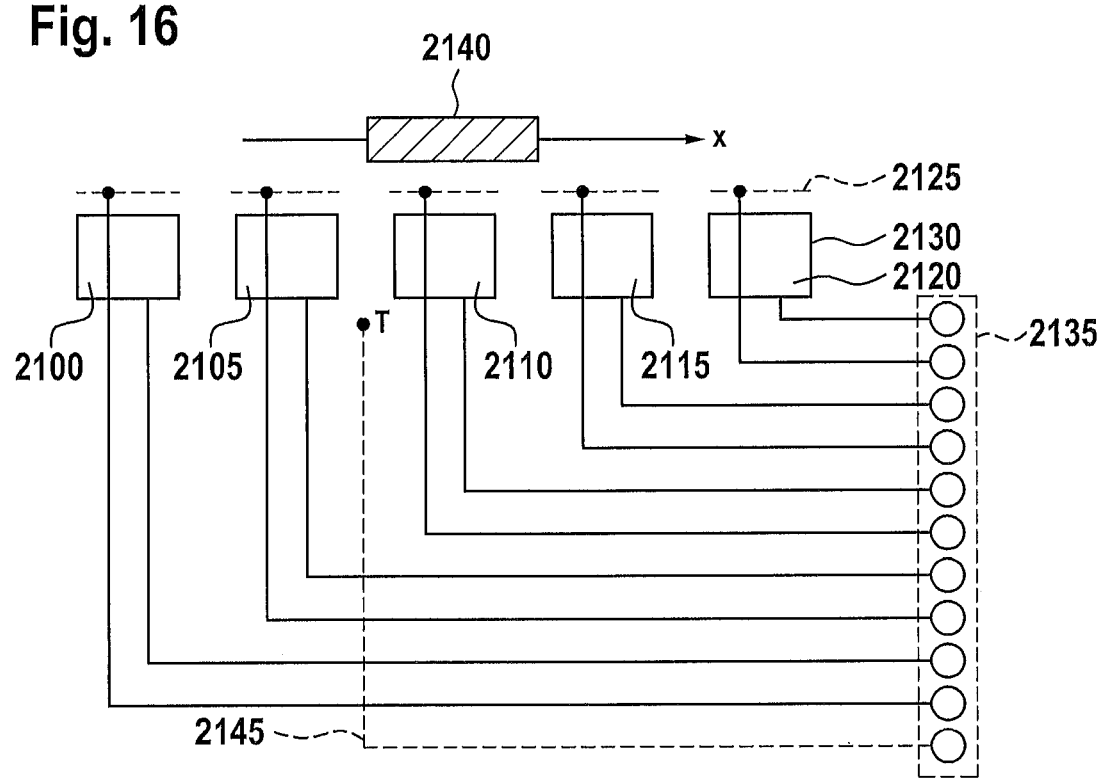

The exemplary embodiment shown in FIG. 16 relates to a position sensor formed from matching sensor units or from sensor units operating in accordance with the same physical measurement principle 2100-2120, wherein each sensor unit 2100-2120 has a capacitive sensor element 2125 (shown in the present case only for the sensor unit 2120) and an inductive sensor element 2130. The primary sensor signals delivered from the sensor elements are supplied to the input layer 2135 of an ANN (not shown). Since the inductive sensor elements 2130 are sensitive both for conductive and for ferromagnetic materials, and the capacitive sensor elements 2125 are additionally sensitive for dielectric materials, a position sensor which can detect both metal and non-metal target objects 2140 can be provided by means of the ANN.

It should be noted that, in addition to the aforementioned primary sensor signals, temperature data 2145 also delivered from the sensor element can be taken into account in the evaluation by the ANN, in the form of complementary sensor signals so to speak.

EXAMPLE 3.3

Figure 17:
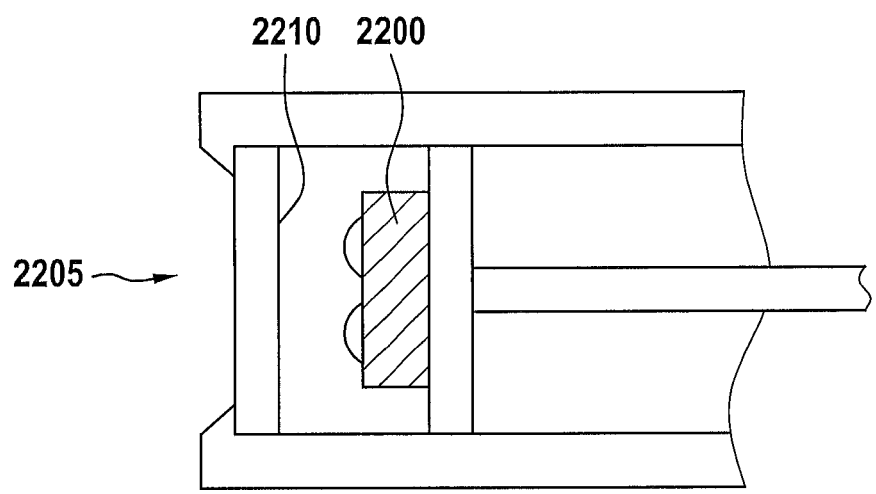

In the exemplary embodiment or application example shown in FIG. 17, an optical distance sensor 2200 is arranged in a window 2205 which has a capacitive sensor 2210 formed from an optically transparent, conductive oxide layer. The measurement signals delivered from the capacitive 2210 and optical 2200 sensor elements are supplied to the input layer of an ANN (not shown in the present case). This type of joining of the aforementioned different measurement signals enables a reliable detection of various target objects, each with very different mechanical and/or electrical properties, and additionally enables an effective suppression of interfering signals.

EXAMPLE 3.4

Figure 18B:
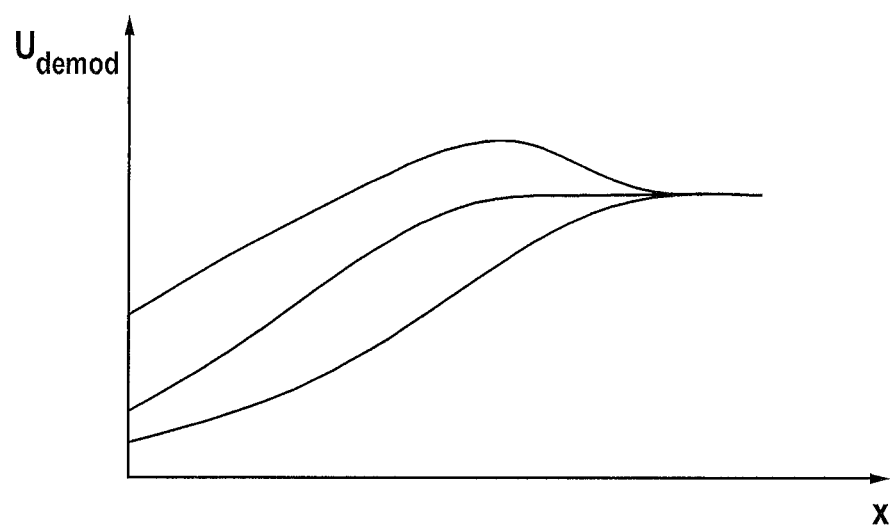
Figure 18C:
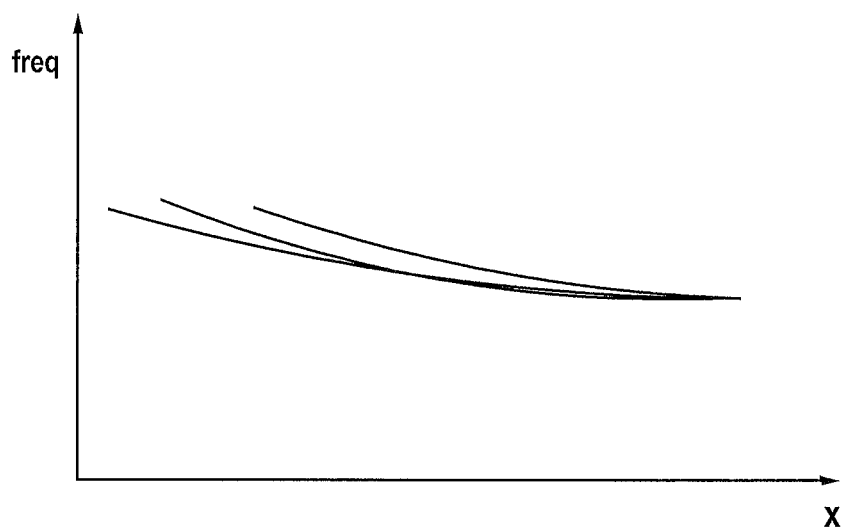

In the exemplary embodiment shown in FIG. 18*a*, a conventional inductive sensor coil 2305 provided with a ferrite core 2300 is used as part of an LC oscillating circuit 2310. Both the demodulated voltage 2315 (see also FIG. 18*b*) and the frequency 2320 (see also FIG. 18*c*) of the oscillating circuit 2310 are detected at the same time, and these two pieces of information are supplied to the input layer 2325 of an ANN (not shown) as primary sensor signals. On this basis, a material-independent distance sensor can be provided, since the target objects consisting of different materials have significantly different and typical amplitude and frequency characteristic line pairs, depending on the distance of the target object in question.

EXAMPLE 3.6

Figure 19:
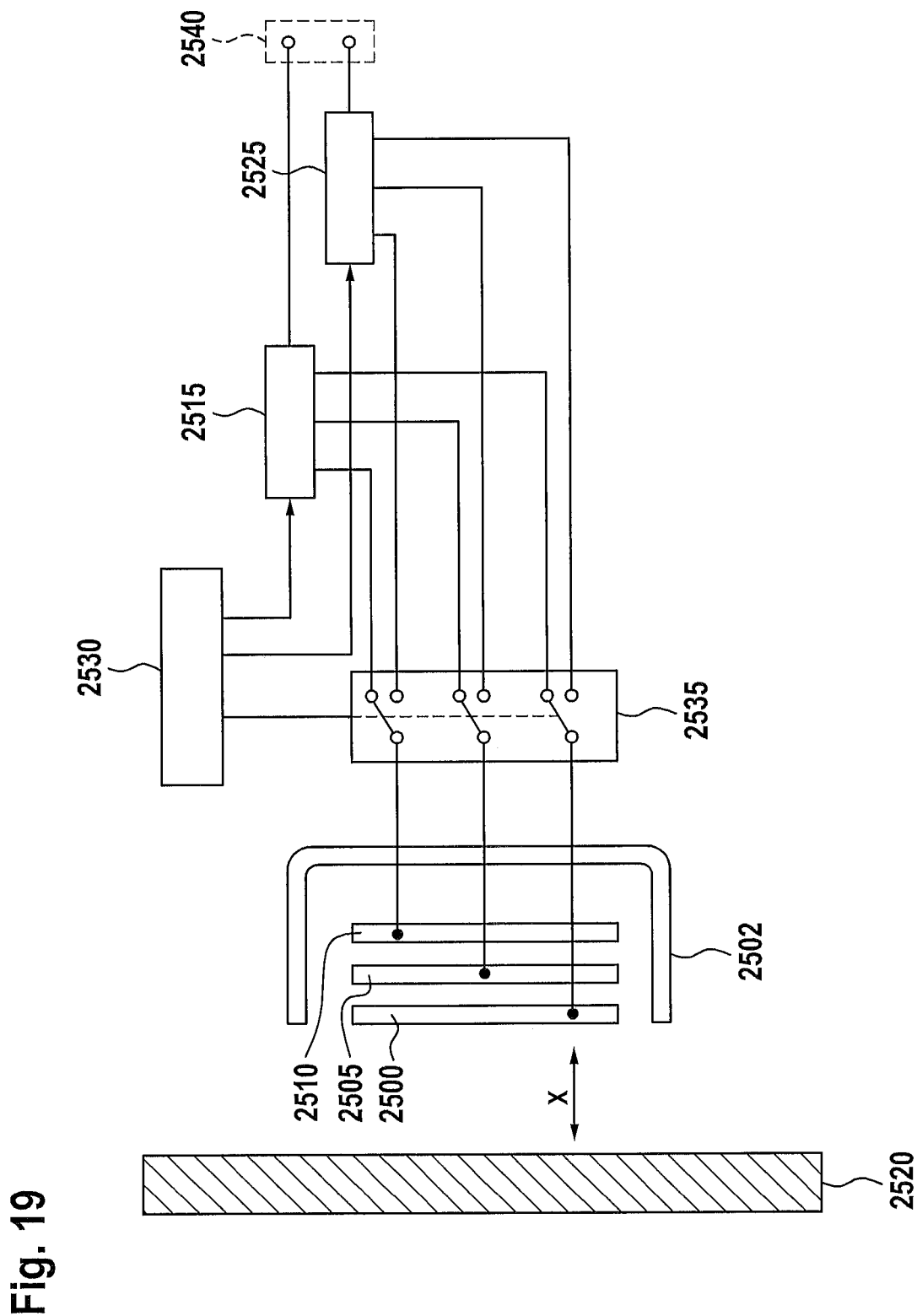

In the exemplary embodiment shown in FIG. 19, a sensor system having a plurality of measuring coils is formed by different layers 2500-2510 of a multi-layer printed circuit board (PCB) arranged in a housing or sensor head 2502. The system works in accordance with two different measurement principles, more specifically in accordance with an inductive measurement principle 2515, wherein one or more of the aforementioned measuring coils 2500-2510 is/are used as receiver coils, and wherein a target object 2520 influences the voltages induced in the receiver coils. The second measurement principle is capacitive in nature 2525, wherein the capacitance of one or more of the measuring coils 2500-2510 is detected. A control unit or measuring unit 2530 performs alternating measurements in accordance with these two measurement principles 2515, 2525 by means of a conventional switching module 2535, wherein one or more inductive 2515 and one or more capacitive 2525 measurement signals are used as primary measurement signals and are supplied to the input layer 2540 of an ANN (not shown) in order to determine the target object distance on the basis of this information, and optionally complementary measured variables, such as the target object material.

EXAMPLE 3.7

Figure 20:
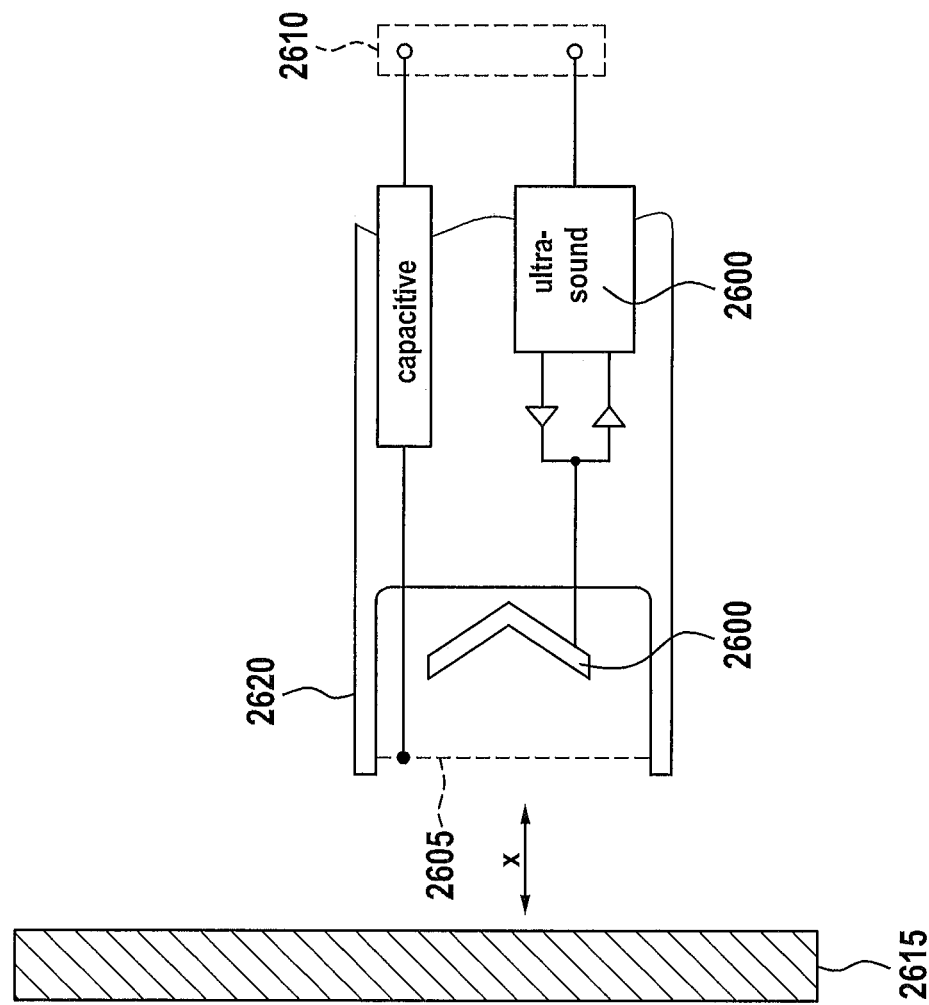

In the exemplary embodiment shown in FIG. 20, measurement signals delivered from an inherently known ultrasound-based distance sensor or converter 2600 and measurement signals delivered from a capacitive sensor element 2605 are evaluated, combined, by means of an ANN (not shown) having an input layer 2610. A measuring system of this type advantageously enables the detection of target objects 2615 which cannot reflect ultrasound and/or of target objects which are positioned already relatively close to the sensor housing 2620, or already too close for a specific measurement principle.

Hereinafter, further exemplary embodiments are described in which an above-described evaluation of two sensor signals is performed for sensor elements which are based on the same measurement principle or at least similar measurement principles, but on different characteristic curves.

Figure 21A:
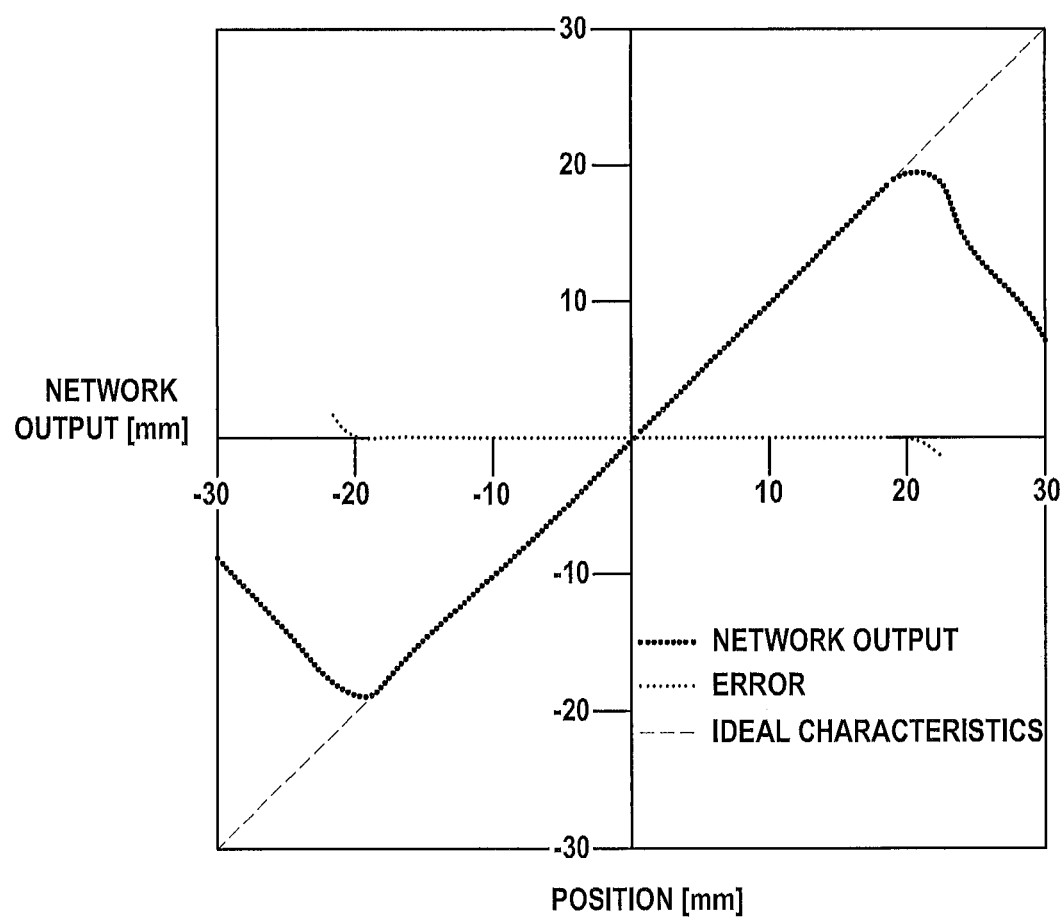
Figure 21B:
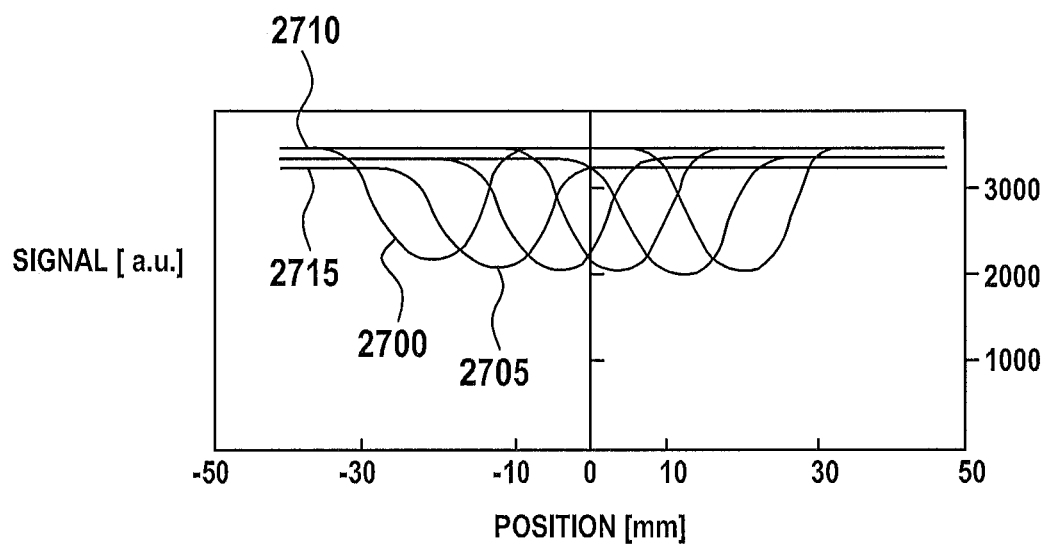
Figure 21C:
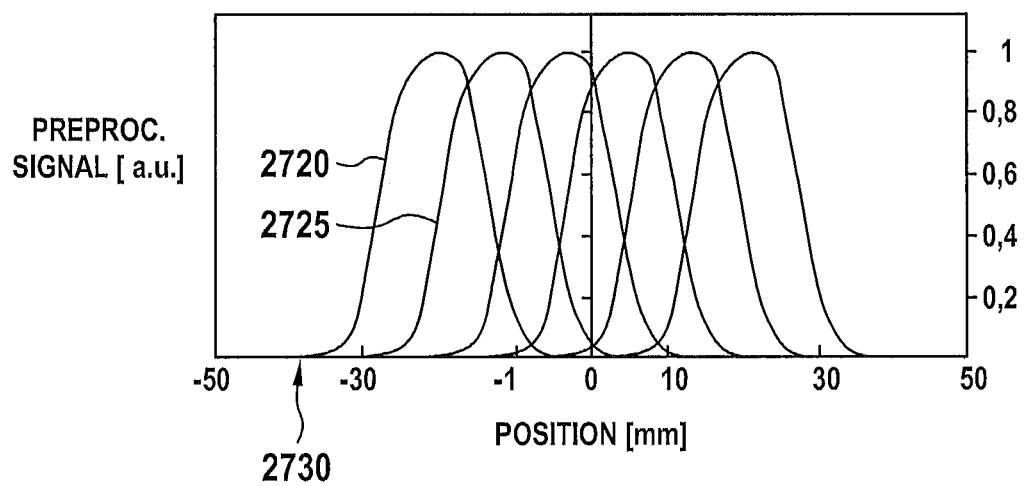

FIGS. 21a to 21c show data measured using a linear measuring system equipped with six coils. The measuring system works in a time-multiplexing operation mode, i.e. at any given moment in time there is always only one coil operated of the individual six coils, wherein the individual coils are each operated self-inductively. The amplitudes of the oscillations act as sensor signals.

The measurement results shown in FIGS. 21a to 21c correspond to a raw signal (FIG. 21b), a pre-processed signal (FIG. 21c) and an output signal of the ANN (FIG. 21a). The ANN in this exemplary embodiment comprised 19 hidden neurons and one output neuron, which had been trained to determine the position of the target object. The measurement accuracy or measurement quality was tested on the basis of signal patterns which correspond to target object positions which were not used for the training of the ANN.

As can be seen from FIG. 21a, the output signal of the ANN ("Network Output") plotted along the ordinate, in the region of approximately ±20 mm of the position of the target object, plotted along the abscissa around a reference position with the value 0, corresponds substantially to the plotted ideal curve ("Ideal Characteristics"). It is also clear from FIG. 21b that the raw measurement signals of the individual coils constitute bell curves that drop downwardly 2700, 2705, which in the signal direction (ordinate) start from slightly varying horizontal curves 2710, 2715 running substantially horizontally at the baseline. As can also be seen from FIG. 21c, the bell curves 2700, 2705 are standardised in terms of amplitude by means of an aforementioned pre-processing of the raw data 2700-2715, more specifically in the present exemplary embodiment are each normalised to the value 1, and are mirrored 2720, 2725 along the abscissa, and the fluctuation shown in FIG. 21b of the horizontal lines 2710, 2715 extending at the baseline has been overcome 2730. It should be noted that the normalisation of the curves shown in FIG. 21c is valid only for a fixedly predefined distance of the target object and therefore has to be carried out afresh for different distances.

Figure 22A:
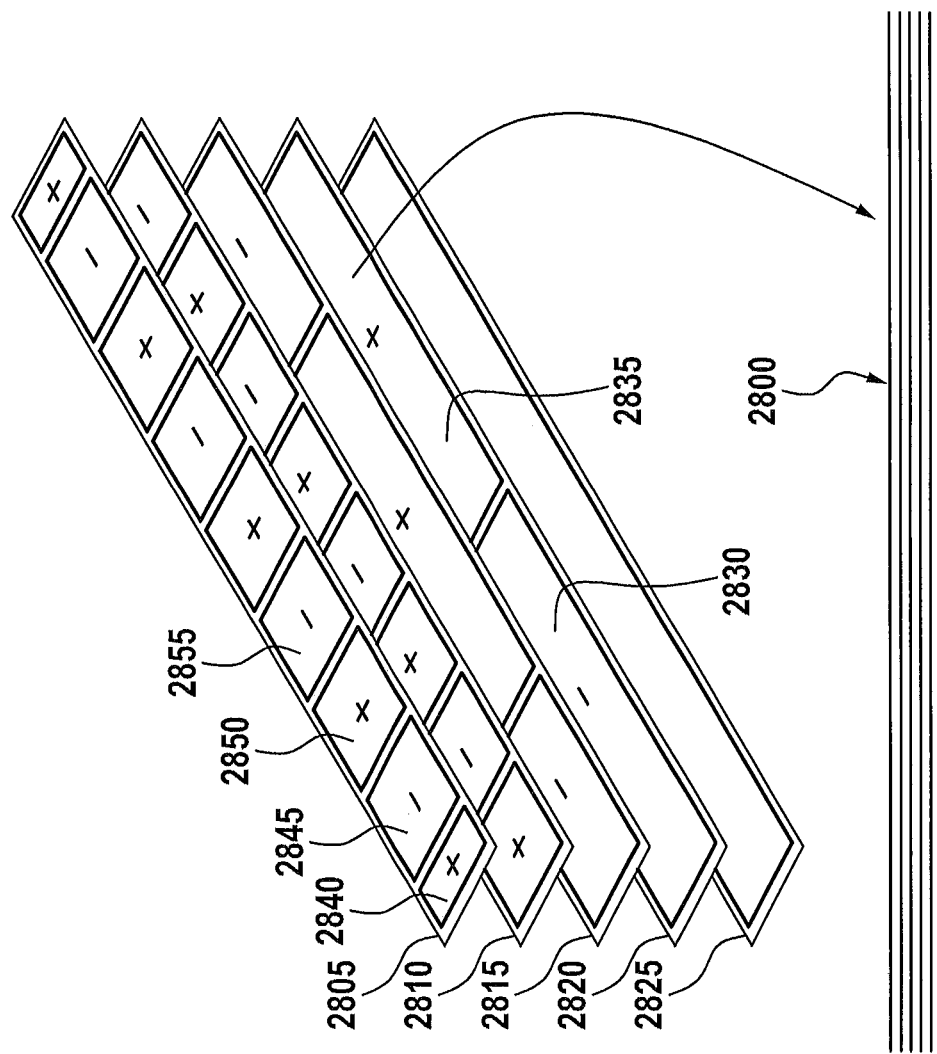

FIG. 22a shows an exemplary embodiment in which a position-sensitive sensor is formed by a multi-layer printed circuit board 2800 ("multi-layer PCB"). This sensor type constitutes a transformer with single input and multi output. The layer 2825 which is the lowermost layer in the present case corresponds to an excitation coil, wherein the further layers 2805-2820 constitute sensing receiver coils. The electromagnetic penetration or coupling of the electric field excited by the excitation coil 2825 into the individual receiver coils 2805-2820 is dependent on the corresponding coil geometry of the receiver coils 2805-2820 and in particular on the position or the distance of a target object, as will become clear from FIG. 22b described hereinafter.

As can also be seen from FIG. 22a, the receiver coils 2805-2820 consist of segments 2830-2855 which are connected to one another in series and which have alternating polarity. The layer 2820 following the excitation coil 2825 corresponds here to a relatively long-wave sine signal, and the subsequent layer 2815 corresponds to a cosine signal, which likewise is a relatively long-wave signal, and the next subsequent layer 2810 corresponds to a relatively short-wave sine signal, and the uppermost layer 2805 in turn corresponds to a relatively short-wave cosine signal. Two sin/cos pairs with relatively long-wave output and with relatively short-wave output are therefore provided.

The dependency on the position of the target object is a consequence of the fact that each of the receiver coils 2805-2820 has different sensor characteristics or has a different characteristic curve, but all coils are subject to the same physical measurement principle.

Figure 22B:
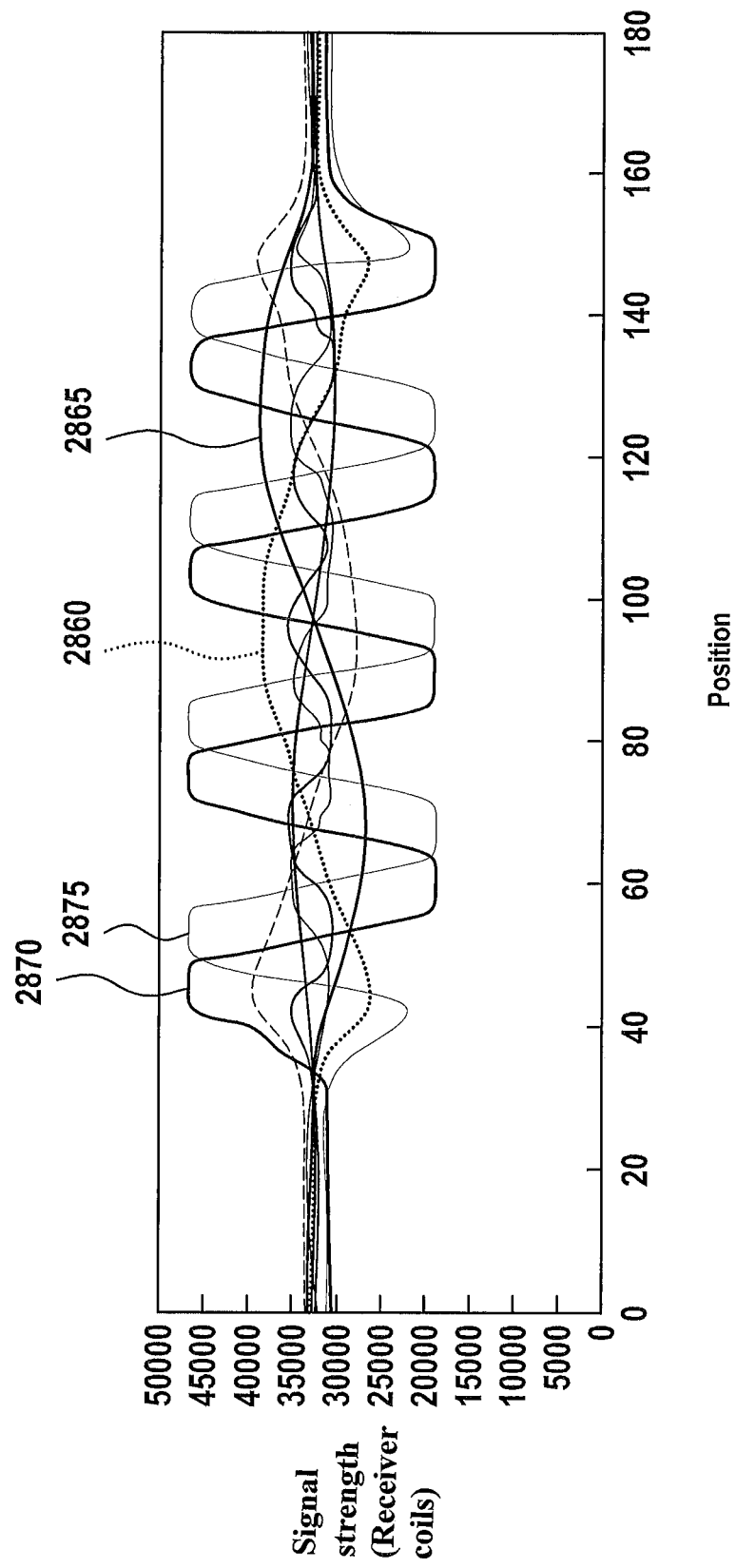

The measurement curves in FIG. 22b show two signal groups for the aforementioned four receiver coils 2805-2820, specifically two relatively long-wave sin/cos pairs 2860, 2865, by means of which a rough estimation of the target object position is made, and also two relatively short-wave sin/cos pairs 2870, 2875, by means of which a relatively accurate position determination is made possible. The short-wave data does not provide any information as to the current wave period, whereas this period information is delivered from the long-wave coil pairs 2815, 2820, since these cover only one wave period within the measurement region shown in FIG. 22c of approximately 100 mm.

It should be noted that further measurement curves are illustrated in FIG. 22b, more specifically a total of eight curves, wherein the rest of the curves correspond, among others, to a quadrature phase as mentioned previously. It should also be noted that the signal profiles deviate very strongly from ideal sine or cosine curves, wherein the exact signal profiles are heavily dependent on the distance between the sensor and the target object.

Figure 22C:
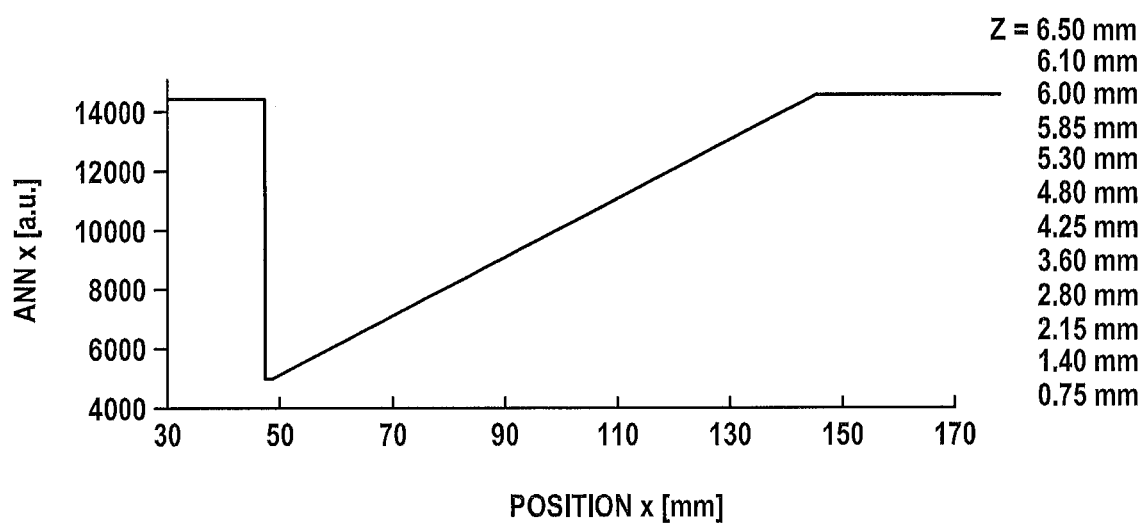
Figure 22D:
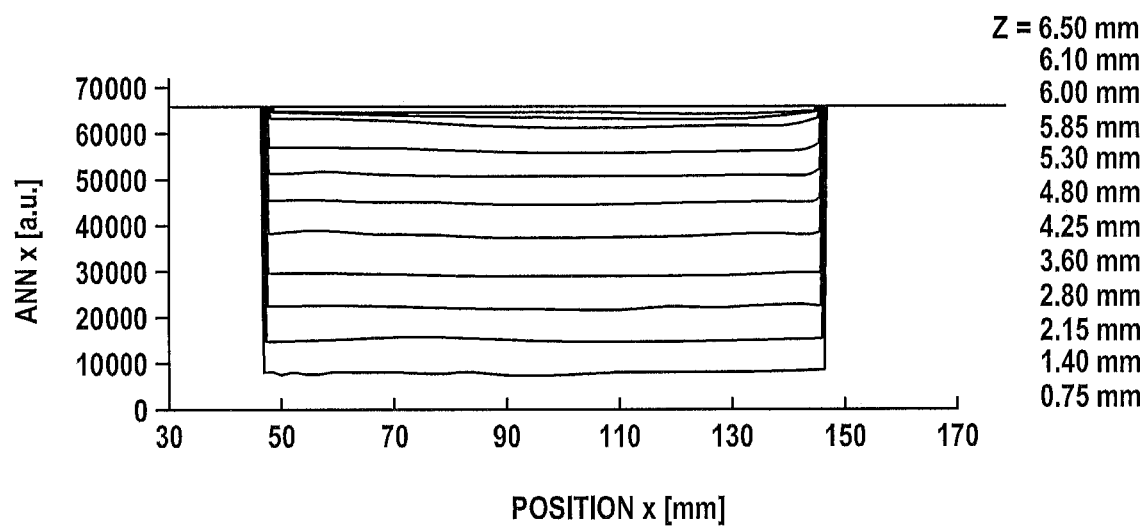
Figure 22E:
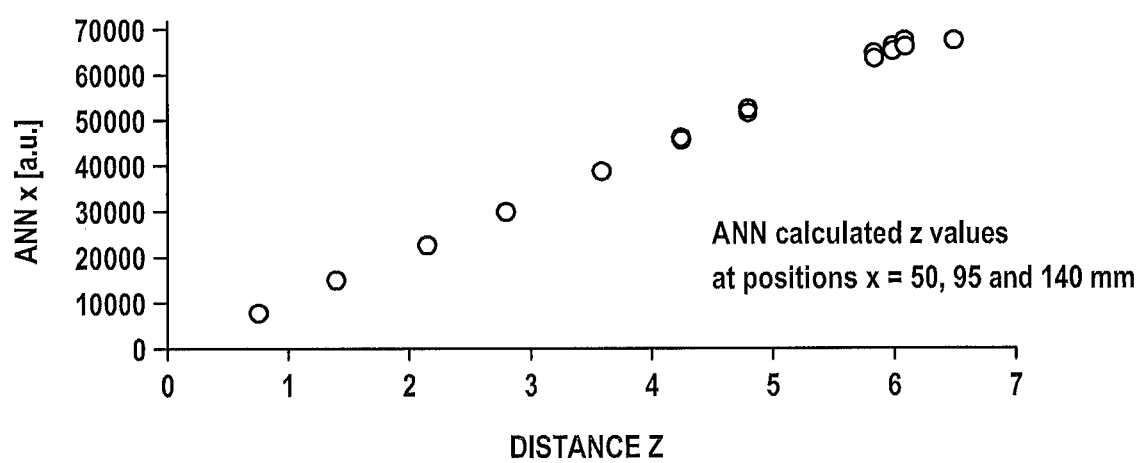

FIGS. 22c to 22e, in the case of a position-sensitive sensor shown in FIG. 22a, show evaluation data that result typically. Thus, FIG. 22c shows position output data delivered from an ANN as a function of the actual x-position of a target object, more specifically for different target object distances z. FIG. 22d also shows distance data delivered from an ANN as a function of the actual x-position of a target object, more specifically again for different target object distances z. Lastly, FIG. 22e shows distance data delivered from an ANN as a function of the actual z-distance of a target object, more specifically measured at three different x-positions, specifically x=50, 95 and 140 mm. it should be noted that in the examples shown in FIGS. 22c to 22e, signal groups shown in FIG. 22b were used as input data of the ANN.

The invention claimed is:
1. A device comprising:
(a) a sensor module comprising first and second sensor elements;
(b) first and second artificial neural networks, wherein each of the first and second artificial neural network is configured to evaluate jointly sensor signals delivered from the first and second sensor elements;
(c) a first pre-processing module connected to the sensor module;
wherein the first pre-processing module and the sensor module are configured to exchange signals and/or data therebetween;
wherein the first pre-processing module is configured to pre-process the sensor signals delivered from the sensor module into pre-processed signals and supply the pre-processed signals to the first artificial neural network;
wherein sensor signals delivered from the first and second sensor elements are supplied to the first artificial neural network, the output data of the first artificial neural network are supplied to a second pre-processing module and pre-processed into pre-processed data and the pre-processed data are supplied to the second artificial neural network;

wherein the sensor signals delivered from the first and second sensor elements are additionally supplied to the second pre-processing module;

wherein the device is configured to determine at least one of a distance and a spatial orientation of a target object relative to the device; and wherein the first artificial neural network is trained by a calibration or learning process in respect of the sensor signals delivered from the first and second sensor elements.

2. The device according to claim 1, wherein the first and second sensor elements are influenced by respective measured variables and possible measurement and/or ambient conditions.

3. The device according to claim 2, wherein the first and second sensor elements are each based on physically different operating principles.

4. The device according to claim 2, wherein the first and second sensor elements are based on physically equivalent or similar operating principles and each have different characteristic curves.

5. The device according to claim 1, wherein the first and second sensor elements are operated statically or dynamically.

6. The device according to claim 5, wherein the aforementioned dynamic operation corresponds to a pulsed operation.

7. The device according to claim 1, wherein, in the case of the calibration or learning process, the first artificial neural network is trained on the corresponding measured variable in different measurement and/or ambient conditions.

8. The device according to claim 1, further comprising a post-processing module and an output module, wherein the output signals of the first artificial neural network are supplied to the post-processing module, wherein the post-processing module post-processes output signals delivered from the first artificial neural network using the output module for display.

9. A method for operating the device according to claim 1, comprising training the first artificial neural network by a calibration or learning process in respect of the sensor signals supplied from the first and second sensor elements.

10. The method according to claim 9, wherein, in the case of the calibration or learning process, the first artificial neural network is trained for each of the first and second sensor elements on the corresponding measured variable in different conditions.

11. The method according to claim 9, wherein the first artificial neural network is trained to extract, from the pre-processed sensor signals, specific parameters which correspond to corresponding parameters of the target object to be detected.

12. The method according to claim 11, wherein the specific parameters concern the distance between the sensor module and the target object, the position of the target object above the first and second sensor elements, or the surface properties of the target object.

13. The method according to claim 12, wherein the first artificial neural network converts the pre-processed sensor signals into output signals which correlate with the surface properties of the target object.

14. The method according to claim 9, wherein the first artificial neural network delivers output signals which indicate the signal quality of the sensor signals delivered from the first and second sensor elements.

15. The method according to claim 9, wherein the sensor signals delivered from the first and second sensor elements constitute static or dynamic waveforms and serve as input signals for the first artificial neural network.

* * * * *